(12) United States Patent
Park et al.

(10) Patent No.: US 7,518,909 B2
(45) Date of Patent: Apr. 14, 2009

(54) NON-VOLATILE MEMORY DEVICE ADAPTED TO REDUCE COUPLING EFFECT BETWEEN STORAGE ELEMENTS AND RELATED METHODS

(75) Inventors: Ki-Tae Park, Seongnam-si (KR); Ki-Nam Kim, Seoul (KR); Yeong-Taek Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 173 days.

(21) Appl. No.: 11/606,908

(22) Filed: Dec. 1, 2006

(65) Prior Publication Data

US 2008/0084746 A1 Apr. 10, 2008

(30) Foreign Application Priority Data

Sep. 30, 2006 (KR) ............... 10-2006-0096711

(51) Int. Cl.
*G11C 16/04* (2006.01)
(52) U.S. Cl. ............... 365/185.02; 365/185.05; 365/185.11; 365/185.12; 365/185.28
(58) Field of Classification Search ........... 365/185.05, 365/185.12, 185.28, 185.02, 185.11
See application file for complete search history.

(56) References Cited

U.S. PATENT DOCUMENTS

| 6,807,095 | B2 | 10/2004 | Chen et al. |
| 6,987,693 | B2 | 1/2006 | Cernea et al. |
| 6,996,003 | B2 | 2/2006 | Li et al. |
| 7,242,620 | B2 * | 7/2007 | Nagashima ............ 365/185.21 |

FOREIGN PATENT DOCUMENTS

| JP | 2003-109386 | 4/2003 |
| JP | 2004-030866 | 1/2004 |
| JP | 2006500729 | 1/2006 |
| KR | 1020030011248 | 2/2003 |
| KR | 1020030071526 | 9/2003 |
| KR | 1020050084586 | 8/2005 |

* cited by examiner

*Primary Examiner*—Hoai V Ho
(74) *Attorney, Agent, or Firm*—Volentine & Whitt, PLLC

(57) ABSTRACT

A non-volatile semiconductor memory device comprises first and second sub-memory arrays and a strapping line disposed between the first and second sub-memory arrays. A programming operation of the first sub-memory array is performed by simultaneously applying a programming voltage to odd and even bit lines connected to memory cells within the first sub-memory array.

17 Claims, 20 Drawing Sheets

COUPLING DISTURBANCE IN X-DIRECTION -> $2C_x \Delta V_x$

NON-VOLATILE MEMORY DEVICE ADAPTED TO REDUCE COUPLING EFFECT BETWEEN STORAGE ELEMENTS AND RELATED METHODS

BACKGROUND OF THE INVENTION

1. Field of the Invention

Embodiments of the invention relate generally to non-volatile memory devices. More particularly, embodiments of the invention relate to technologies adapted to reduce a coupling effect between storage elements in the non-volatile memory devices.

A claim of priority is made to Korean Patent Application No. 2006-0096711, filed on Sep. 30, 2006, the disclosure of which is hereby incorporated by reference in its entirety.

2. Description of Related Art

FIG. 1 is a block diagram of a conventional memory array 10 including a plurality of sub-memory arrays. Referring to FIG. 1, memory array 10 includes a plurality of sub-memory arrays including a first sub-memory array 11, a second sub-memory array 13, and a plurality of strapping lines 12 formed in a bit line direction (or a column direction) between adjacent sub-memory arrays. Each of sub-memory arrays 11 and 13 includes a plurality of even bit lines and a plurality of odd bit lines.

FIG. 2 is a block diagram of a non-volatile memory device 20 including memory array 10 illustrated in FIG. 1. Referring to FIG. 2, non-volatile memory device 20 includes memory array 10, a row decoder 12, a control signal generation circuit 14, a switching block 16, and a page buffer 18. Sub-memory array 11 in memory array 10 includes even bit lines BLe1 and BLe2 and odd bit lines BLo1 and BLo2. Similarly, sub-memory array 13 in memory array 10 includes even bit lines BLe1' and BLe2' and odd bit lines BLo1' and BLo2'. Cell strings 15 are respectively connected with even bit lines BLe1, BLe2, BLe1' and BLe2' and odd bit lines BLo1 and BLo2, BLo1', and BLo2'. Each of cell strings 15 typically comprises a NAND string.

Each of cell strings 15 includes a first selection transistor, a second selection transistor, and a plurality of NAND flash electrically erasable and programmable read only memory (EEPROM) cells connected in series between the first and second selection transistors. For explanation purposes, memory cells connected to even bit lines may be referred to throughout this written description as "even memory cells" and memory cells connected to odd bit lines may be referred to as "odd memory cells." Each NAND flash EEPROM cell included in each cell string 15 is formed in a P-type region or an N-type region. The P-type region is typically formed within an N-type well formed in a P-type substrate and the N-type region is typically formed within a P-type well formed in an N-type substrate.

Strapping lines 12 include a strapping line for applying a voltage to the P-type region (or the N-type region), a strapping line for applying a voltage to a common source line, a bit line connected with dummy memory cells, and a strapping line for contacts. Each of strapping lines 12 is typically formed with a structure similar to bit lines connected with respective cell strings 15.

The memory cells illustrated in memory array 10 are multi-level cells. In other words, the memory cells can be programmed to store more than one bit of data by adjusting the respective threshold voltages of the memory cells to different levels. For illustration purposes, multi-level memory cells for storing 2-bit data will be described. However, some multi-level cells can store more than 2 bits. In the 2-bit data, an upper bit will be referred to as $2^{nd}$ page data and a lower bit will be referred to as $1^{st}$ page data.

FIG. 3 is a block diagram illustrating one order in which memory cells in sub-memory array 11 or 13 illustrated in FIG. 2 can be programmed. Here, memory cells are programmed in units of odd and even pages. In other words, even memory cells connected to the same word line are programmed at the same time and odd memory cells connected to the same word line are programmed at the same time. A method of programming memory cells in sub-memory array 11 or 13 is described below with reference to FIGS. 1 through 3.

As shown in FIG. 2, switching block 16 comprises switches 16-1 through 16-8 and page buffer 18 includes storage elements 18-1 through 18-4. Switches 16-1, 16-3, 16-5, and 16-7 respectively connect even bit lines BLe1, BLe2, BLe1', and BLe2' in sub-memory array 11 and 13 with respective data storage elements 18-1, 18-2, 18-3 and 18-4 in response to a first control signal output from control signal generation circuit 14. Similarly, switches 16-2, 164, 16-6, and 16-8 in switching block 16 respectively connect odd bit lines BLo1, BLo2, BLo1', and BLo2' in sub-memory array 11 and 13 with respective data storage elements 18-1, 18-2, 18-3, and 18-4 in response to a second control signal output from control signal generation circuit 14. Accordingly, as illustrated in FIG. 3, a program operation or read operation can be performed on odd memory cells or even memory cells according to the first and second control signals. The memory cells are programmed in an order indicated by the reference numerals 0 through 11. For example, $1^{st}$ page data is programmed in memory cells connected to odd bit lines, as indicated by reference numerals "0". Then $1^{st}$ page data is programmed in memory cells connected to even bit lines, as indicated by reference numerals "1". Next, $2^{nd}$ page data is programmed in memory cells connected to odd bit lines as indicated by reference numeral "2", and so on.

FIG. 4 is a conceptual diagram illustrating a coupling effect between conventional memory cells. The coupling effect occurs where a threshold voltage change $\Delta Vx$ of one or more memory cells causes a threshold voltage change in other, e.g., adjacent memory cells. For example, where even memory cells in FIG. 4 are programmed, a threshold voltage of an odd memory cell in FIG. 4 may change due to coupling capacitances Cx between the even memory cells and the odd memory cell.

The magnitude of the coupling effect can be roughly quantified in proportion to a combination of coupling capacitances Cx and the threshold voltage change $\Delta Vx$ of the even memory cells. For example, the magnitude of the coupling effect can be roughly quantified as $2Cx\Delta Vx$.

Due to the coupling effect, additional program operations may be required to correct threshold voltage distributions in the memory cells. Unfortunately, however, these additional program operations tend to stress the memory cells. As a result, the reliability of the memory cells may deteriorate.

FIGS. 5A through 5D illustrate threshold voltage distributions for memory cells affected by coupling capacitance when programmed using a conventional programming method. Reference numerals shown in FIGS. 5A through 5D indicate the order in which memory cells are programmed.

Referring to FIG. 5A, where selected even memory cells connected to a word line WL0 are programmed from a threshold voltage state "11" to a threshold voltage state "01" in a program operation indicated by reference numeral "3", a threshold voltage of a memory cell labeled "worst case cell" is affected by a threshold voltage change $\Delta Vx1$ of the selected even memory cells. In FIG. 5A, the labels Vo10, Vo00, and Vo01 denote program verify voltage levels used to verify that memory cells are properly programmed.

Referring to FIG. 5B, where even memory cells connected to a word line WL1 are programmed in a program operation indicated by reference numeral "7", the threshold voltage of the memory cell labeled "worst case cell" is affected by threshold voltage changes $\Delta Vx1$ of horizontally adjacent memory cells, by a threshold voltage change $\Delta Vy1$ of a vertically adjacent memory cell and threshold voltage changes $\Delta VXy1$ of diagonally adjacent memory cells.

The memory cells in FIGS. 5C and 5D are programmed in a different order than the memory cells in FIGS. 5A and 5B. Referring to FIG. 5C, where selected even memory cells connected to word line WL0 are programmed from threshold voltage state "11" to a threshold voltage state "10" in an operation indicated by reference numeral "5", for example, the threshold voltage of the memory cell labeled "worst case cell" is affected by threshold voltage changes $\Delta Vx2$ of the selected even memory cells.

Referring to FIG. 5D, where selected even memory cells connected to word line WL1 are programmed in an operation indicated by reference numeral "7", the threshold voltage of the memory cell labeled "worst case cell" is affected by threshold voltage changes $\Delta Vx2$ of horizontally adjacent even memory cells, by a threshold voltage change $\Delta Vy2$ of a vertically adjacent odd memory cell, and threshold voltage changes $\Delta Vxy2$ of diagonally adjacent memory cells.

Based on the above description related to FIGS. 5A through 5D, the threshold voltage of the memory cell labeled "worst case cell" is affected by threshold voltage changes $\Delta Vx1$, $\Delta Vx2$, and $\Delta Vxy2$, even when the programming order is varied. As a result, the performance and reliability of the memory cells tends to deteriorate.

SUMMARY OF THE INVENTION

Recognizing at least the above shortcomings of conventional devices, embodiments of the invention provide a non-volatile memory device and related methods adapted to reduce a coupling effect between horizontally adjacent storage elements.

According to one embodiment of the invention, a method of operating a non-volatile memory device is provided. The non-volatile memory device comprises a memory array, and the memory array comprises a first sub-memory array including a plurality of cell strings and a plurality of even and odd bit lines respectively connected to the plurality of cell strings, a second sub-memory array including a plurality of cell strings and a plurality of even and odd bit lines respectively connected to the plurality of cell strings, and a strapping line extending in a column direction between the first sub-memory array and the second sub-memory array. The method comprises receiving page data to be programmed, and simultaneously applying a bit line voltage corresponding to the page data to the plurality of even and odd bit lines in the first sub-memory array to program the page data in the plurality of cell strings in the first sub-memory array.

According to another embodiment of the invention, a method of programming a non-volatile memory device is provided. The non-volatile memory device comprises a first sub-memory array, a second sub-memory array, a plurality of word lines connected to the first and second sub-memory arrays, and a strapping line extending in a column direction between the first sub-memory array and the second sub-memory array. The method comprises applying a first operating voltage to a selected word line among the plurality of word lines and applying a second operating voltage to all non-selected word lines among the plurality of word lines, and performing a first program operation by simultaneously programming data to all memory cells included in the first sub-memory array and connected to the selected word line.

According to yet another embodiment of the present invention, a non-volatile memory device comprises a first sub-memory array including a plurality of cell strings respectively connected with a plurality of first bit lines, a second sub-memory array including a plurality of cell strings respectively connected with a plurality of second bit lines, a strapping line formed between the first sub-memory array and the second sub-memory array, a page buffer including a plurality of data storage elements, and a switching block configured to perform a first switching operation for simultaneously connecting a first subset of the plurality of data storage elements with all of the respective first bit lines and a second switching operation for simultaneously connecting a second subset of the plurality of data storage elements with all of the respective second bit lines in response to at least one control signal.

According to still another embodiment of the invention, a non-volatile memory device comprises a memory array comprising a first sub-memory array including a plurality of cell strings respectively connected with a plurality of first bit lines, a second sub-memory array including a plurality of cell strings respectively connected with a plurality of second bit lines, and at least one strapping line disposed between the first sub-memory array and the second sub-memory array. The device further comprises a page buffer including a plurality of first data storage elements and a plurality of second data storage elements, and a switching block configured to perform a first switching operation to simultaneously connect the first data storage elements with the respective first bit lines in response to at least one first control signal, and further configured to perform a second switching operation to simultaneously connect the second data storage elements with the respective second bit lines in response to at least one second control signal.

According to still another embodiment of the invention, a non-volatile memory device comprises a memory array including a first sub-memory array including a plurality of cell strings respectively connected with a plurality of first bit lines and a plurality of cell strings connected with a plurality of second bit lines, a second sub-memory array including a plurality of cell strings respectively connected with a plurality of third bit lines and a plurality of cell strings connected with a plurality of fourth bit lines, and a strapping line disposed between the first sub-memory array and the second sub-memory array. The device further comprises a page buffer including a plurality of first data storage elements and a plurality of second data storage elements, a plurality of first switches respectively connected between the first bit lines and the first data storage elements, a plurality of second switches respectively connected between the second bit lines and the second data storage elements, a plurality of third switches respectively connected between the third bit lines and the first data storage elements, and a plurality of fourth switches respectively connected between the fourth bit lines and the second data storage elements.

According to yet another embodiment of the invention, a non-volatile memory device is provided. The device comprises a word line, a first sub-memory array including a plurality of memory cells connected to the word line and formed in a first conductivity type region, a second sub-memory array including a plurality of memory cells connected to the word line and formed in the first conductivity type region, a strapping line disposed between the first sub-memory array and the second sub-memory array and adapted to apply a voltage to the first conductivity type region, and a program control block configured to perform at least one operation among a first program operation for programming first page data to the plurality of memory cells included in the first sub-memory array and a second program operation for programming second page data to the plurality of memory cells included in the second sub-memory array in response to at least one control signal during a program operation.

BRIEF DESCRIPTION OF THE DRAWINGS

Embodiments of the invention are described in relation to the accompanying drawings. Throughout the drawings like reference numbers indicate like exemplary elements, components, and steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 6A:
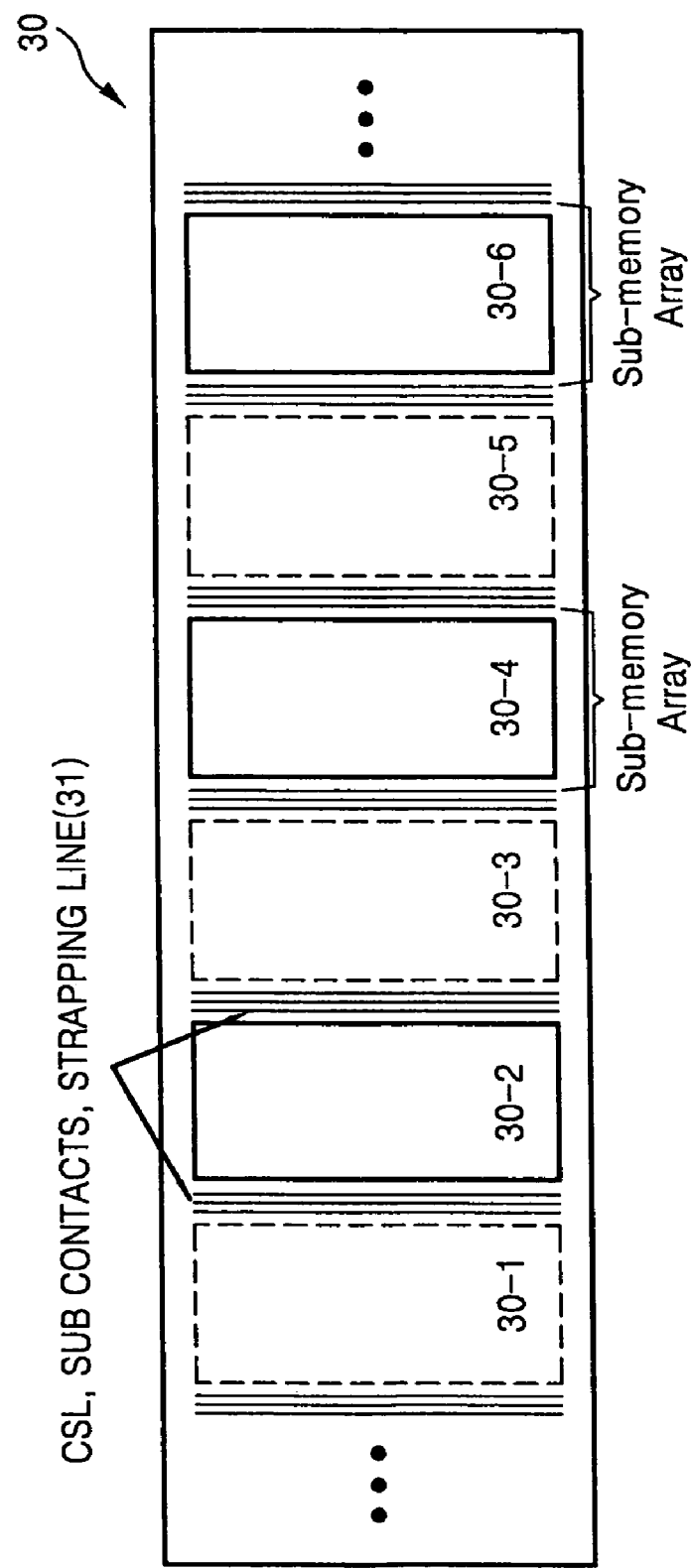
FIG. 6A is a block diagram of a memory array including sub-memory arrays according to selected embodiments of the invention.
Figure 6B:
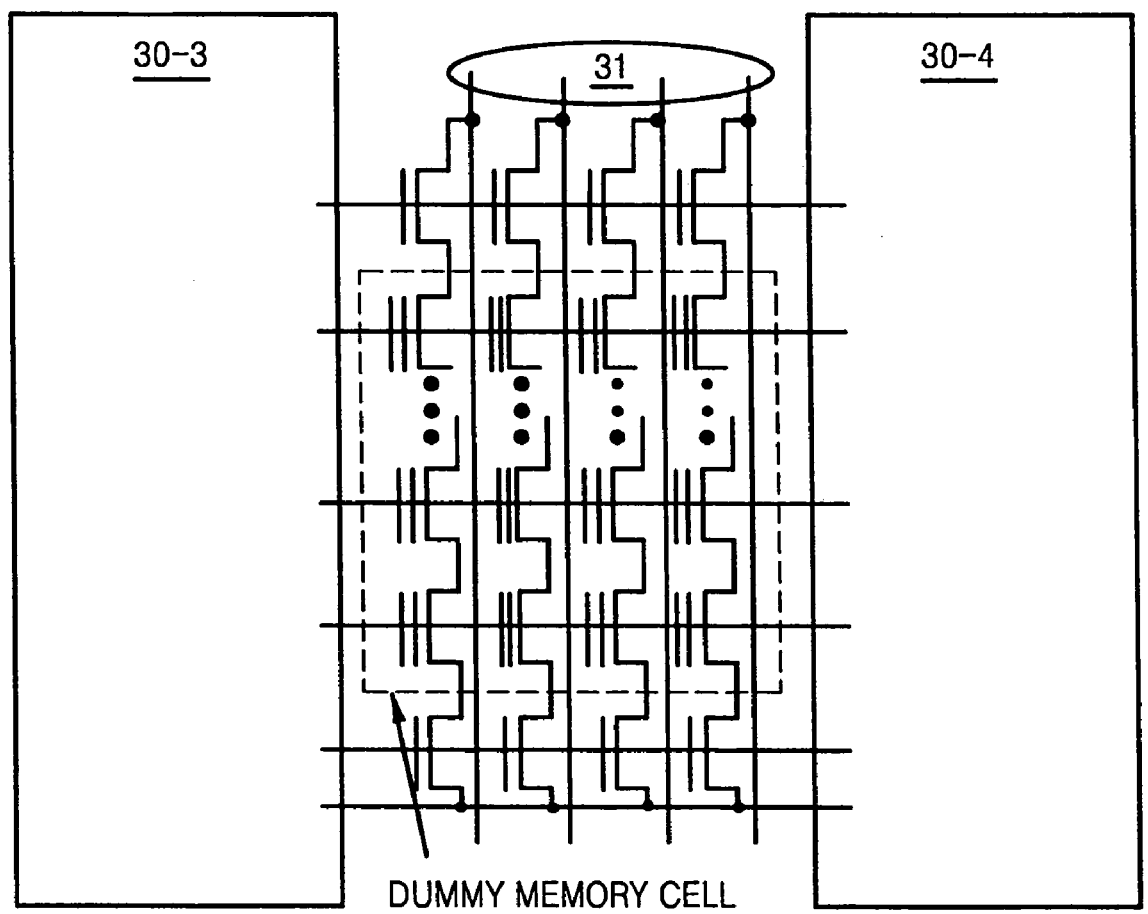
FIG. 6B is a block diagram illustrating an example of a strapping line according to selected embodiments of the invention.

FIG. 6A is a block diagram of a memory array 30 including sub-memory arrays according to selected embodiments of the invention. FIG. 6B illustrates an example of a strapping line 31 according to selected embodiments of the invention. Referring to FIGS. 6A and 6B, memory array 30 includes a plurality of sub-memory blocks 30-1 through 30-6. A plurality of strapping lines 31 extending in a bit line or column direction are arranged between adjacent sub-memory blocks, e.g., between sub-memory blocks 30-1 and 30-2, 30-2 and 30-3, 30-3 and 30-4, 30-4 and 30-5, and 30-5 and 30-6.

Each of strapping lines 31 includes a strapping line for supplying power to a common source line, a strapping line for applying a voltage to a memory sub-region (e.g., a P-type region or an N-type region) in which memory cells are formed, and a bit line connected with dummy memory cells. Each of strapping lines 31 is typically formed with a structure similar to that of bit lines connected to cell strings in memory array 30.

Referring to FIG. 6A, a single sub-memory block forms a single sub-memory array. Each of sub-memory blocks 30-1 though 30-6 includes a plurality of even bit lines and a plurality of odd bit lines.

Figure 7:
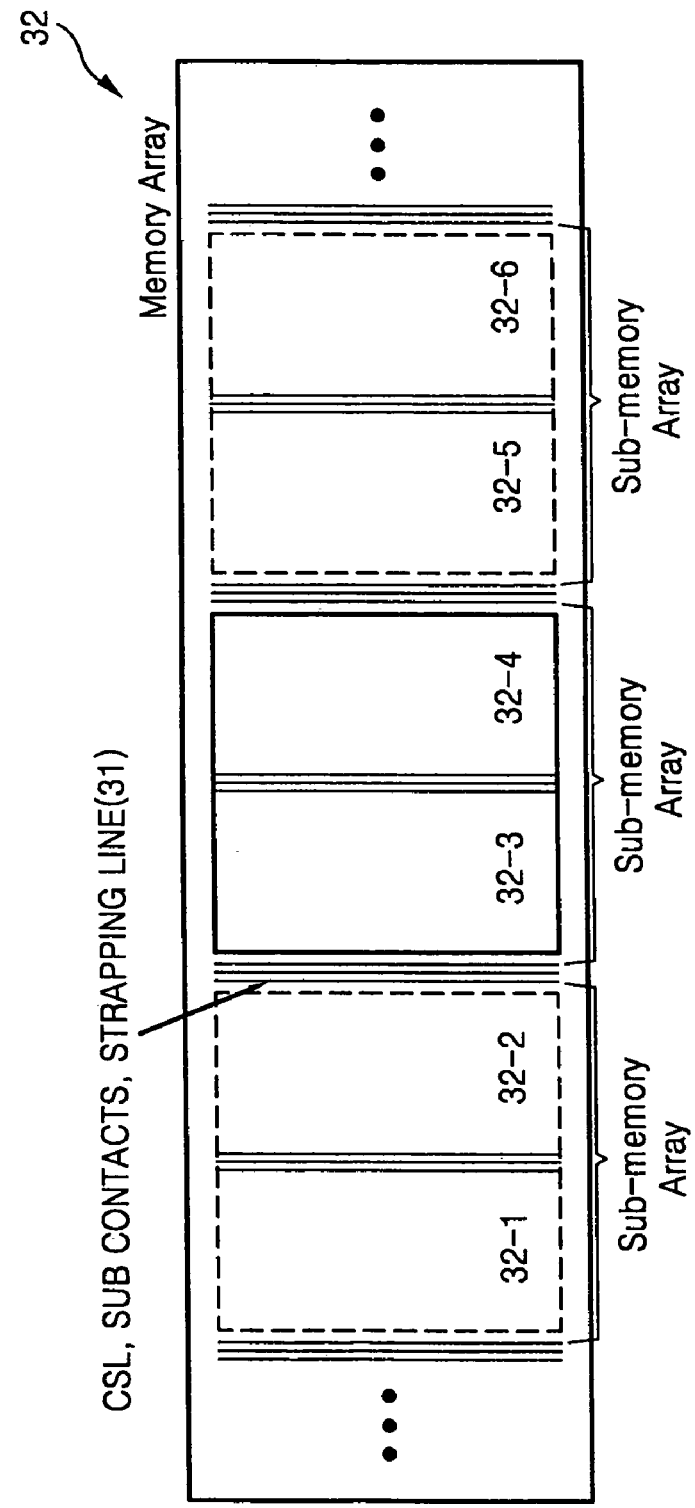
FIG. 7 is a block diagram of a memory array including sub-memory arrays according to selected embodiments of the invention.

FIG. 7 is a block diagram of a memory array 32 including sub-memory arrays according to selected embodiments of the present invention. Referring to FIG. 7, memory array 32 included in a non-volatile memory device includes a plurality of sub-memory blocks 32-1 through 32-6 and strapping lines 31. At least one of strapping lines 31 extending in a bit line direction is arranged between adjacent sub-memory blocks, e.g., between sub-memory blocks 32-1 and 32-2, 32-2 and 32-3, 32-3 and 32-4, 32-4 and 32-5, and 32-5 and 32-6. In memory array 32 two sub-memory blocks, for example, sub-memory blocks 32-1 and 32-2, 32-3 and 32-4, and 32-5 and 32-6, form a single sub-memory array. According to other embodiments of the invention, a sub-memory array may include more than two sub-memory blocks.

Figure 8:
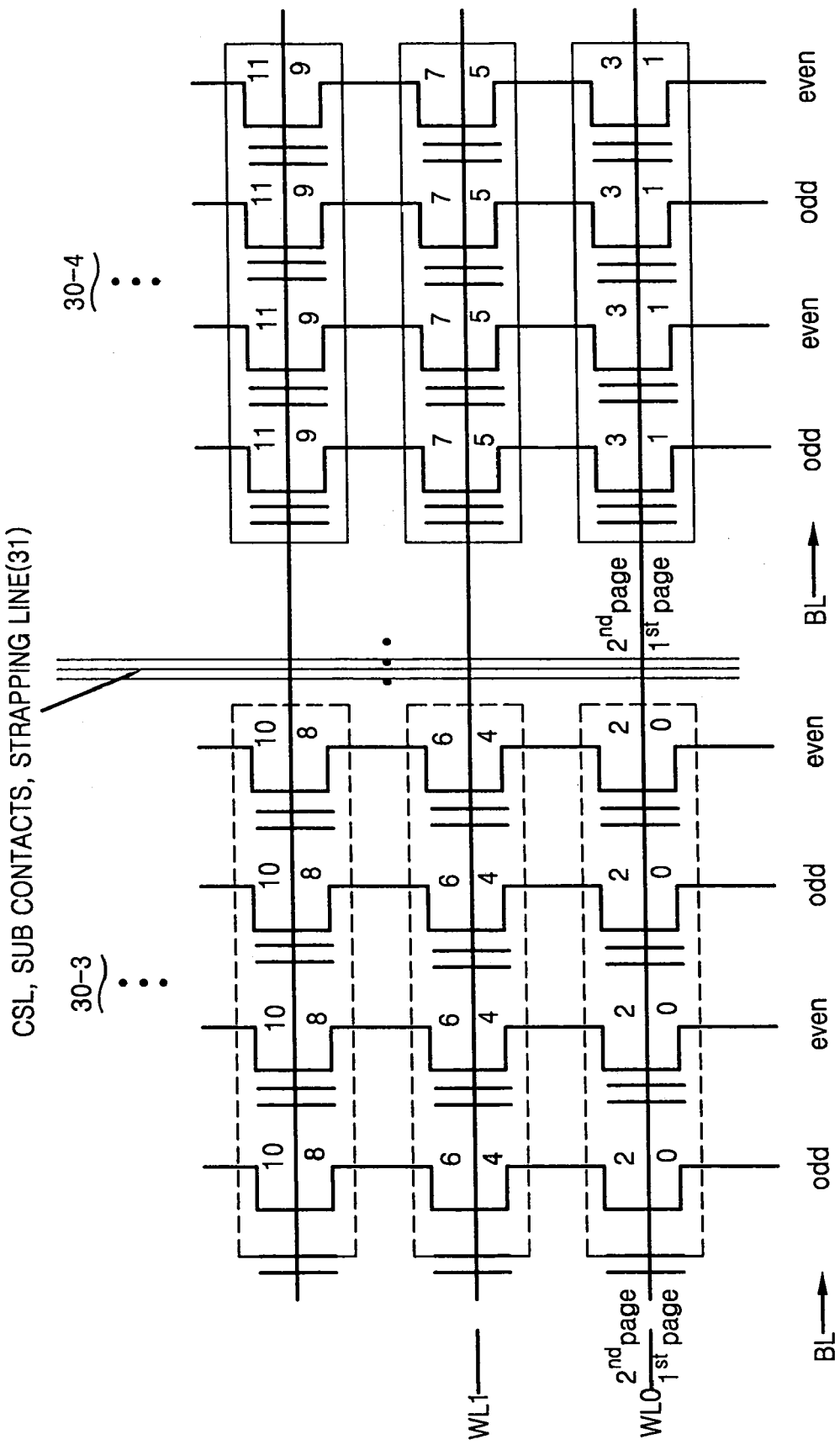
FIG. 8 illustrates an order for programming memory cells in the memory array illustrated in FIGS. 6A and 7.

FIG. 8 illustrates an order in which memory cells can be programmed in memory array 30 or 32 illustrated in FIG. 6A or FIG. 7. The memory cells are typically programmed by page unit, and therefore memory cells within the same page, i.e., having the same page address, are generally programmed at the same time. As an example, in FIG. 8, all even and odd memory cells connected to the same word line in the same sub-memory array are programmed at the same time. For instance, during a first program operation, where a first page or a least significant bit (LSB) is programmed, a first word line WL0 connected to a first sub-memory array 30-3 is selected. A program voltage is applied to first word line WL0 connected to first sub-memory array 30-3, and all memory cells in sub-memory array 30-3 connected with first word line WL0 are programmed with first page data.

After the first program operation completes, the programmed memory cells connected with even bit lines and memory cells connected with odd bit lines in sub-memory array 30-3 are alternately verified. Next, during a second program operation, first word line WL0 connected to a second sub-memory array 30-4 is selected. The program voltage is applied to selected first word line WL0, and all memory cells connected with first word line WL0 in second sub-memory array 304 are programmed with first page data. After the second program operation is finished, the programmed memory cells connected with even bit lines and memory cells connected with odd bit lines in sub-memory array 30-4 are alternately verified.

Next, second page data is programmed in the memory cells connected to word line WL0 in first sub-memory array 30-3, then second page data is programmed in the memory cells connected to word line WL0 in second sub-memory array 30-4, and so on.

The memory cells included in first and second sub-memory arrays 30-3 and 30-4 preferably comprise NAND flash electrically erasable and programmable read only memory (EEPROM) cells. The memory cells may single level cells (SLCs) or multi-level cell (MLCs). In other words, a storage element, i.e., a floating gate of a NAND flash EEPROM cell may store one or more bits of data according to the amount of stored charges.

The reference numerals 0 through 11 in FIG. 8 indicate the order in which memory cells are programmed or written to. According to selected embodiments of the present invention, memory cells connected to the same word line in each of sub-memory cell arrays 30-3 and 30-4 can be programmed at one time using the same page address regardless of even and odd bit lines.

Figure 9:
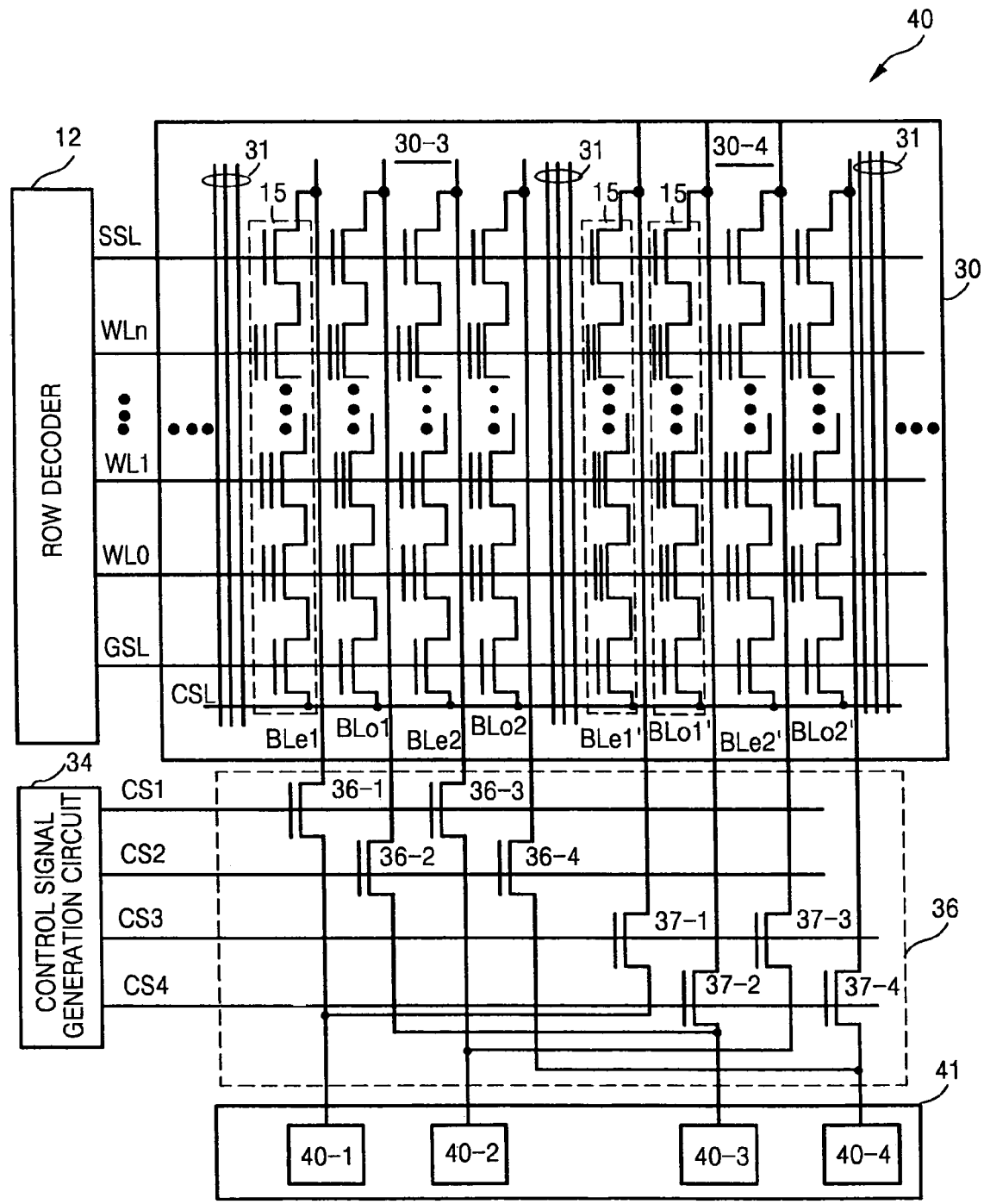
FIG. 9 is a block diagram of a non-volatile memory device including a memory array according to selected embodiments of the invention.

FIG. 9 is a block diagram of a non-volatile memory device 40 including a memory array 30 according to an embodiment of the invention. Referring to FIG. 9, non-volatile memory device 40 includes memory array 30, a row decoder 12, a control signal generation circuit 34, a switching block 36, and a page buffer 41. Switching block 36 includes switches 36-1 through 36-4 and 37-1 and 37-4 and page buffer 41 includes data storage elements 40-1 through 40-4.

Memory array 30 includes a plurality of sub-memory arrays, including first sub-memory array 30-3 and second sub-memory array 30-4. First sub-memory array 30-3 includes a plurality of cell strings 15 which are respectively connected with first bit lines BLe1, BLo1, BLe2, and BLo2. Second sub-memory array 30-4 includes a plurality of cell strings 15 which are respectively connected with second bit lines BLe1', BLo1', BLe2', and BLo2'. Here, the label "BLe" denotes an even bit line and the label "BLo" denotes an odd bit line. Each of cell strings 15 includes a fist selection transistor, a second selection transistor, and a plurality of NAND flash EEPROM cells connected in series between the first and second selection transistors. At least one strapping line extending in a bit line or column direction is disposed between first sub-memory array 30-3 and second sub-memory array 30-4.

Row decoder 12 typically functions as a word line driving circuit. Row decoder 12 may select one of a plurality of word lines WL1 through WLn in response to a row address and apply a first operating voltage to the selected word line and a second operating voltage to non-selected word lines. For instance, in a program mode, row decoder 12 typically applies the first operating voltage, e.g., a program voltage, to the selected word line and the second operating voltage, e.g., a pass voltage, to the non-selected word lines. As an example, the program voltage may be between 15 and 20 V and the pass voltage may be about 10 V. Alternatively, in a read mode, row decoder 12 typically applies the first operating voltage, e.g., a ground voltage, to the selected word line and the second operating voltage, e.g., a read voltage, to the non-selected word lines. The read voltage is typically around 4.5 V. The program voltage is generally higher than the pass voltage, and the pass voltage is generally higher than the read voltage.

Control signal generation circuit 34 typically generates at least one of control signals CS1 through CS4. Alternately, control signal generation circuit 34 may generate at least one of signals CS1 and CS2 and at least one of control signals CS3 and CS4. Control signal generation circuit 34 is generally implemented as a bit line driving circuit or a special circuit for accessing bit lines in memory array 30. More specifically, control signal generation circuit 34 typically generates at least one among first control signal CS1 for controlling switches 36-1 and 36-3, second control signal CS2 for controlling switches 36-2 and 36-4, third control signal CS3 for controlling switches 37-1 and 37-3, and fourth control signal CS4 for controlling switches 37-2 and 37-4.

Each of switches 36-1 through 36-4 comprises a MOS transistor and referred to as a first transistor, and each of first transistors 36-1 through 36-4 is connected between a corresponding one among first bit lines BLe1, BLo1, BLe2, and BLo2 and a corresponding one among data storage elements 40-1 through 40-4. For instance, transistor 36-1 is connected between first bit line BLe1 and data storage element 40-1, transistor 36-2 is connected between first bit line BLo1 and data storage element 40-3, transistor 36-3 is connected between first bit line BLe2 and data storage element 40-2, and transistor 36-4 is connected between first bit line BLo2 and data storage element 40-4.

Each of second switches 37-1 through 37-4 comprises a MOS transistor and referred to as a second transistor, and each of second transistors 37-1 through 37-4 is connected between a corresponding one among second bit lines BLe1', BLo1', BLe2', and BLo2' and a corresponding one among plurality of data storage elements 40-1 through 40-4. For instance, transistor 37-1 is connected between second bit line BLe1' and data storage element 40-1, transistor 37-2 is connected between second bit line BLo1' and data storage element 40-3, transistor 37-3 is connected between second bit line BLe2' and data storage element 40-2, and transistor 374 is connected between second bit line BLo2' and data storage element 404.

Figure 1:
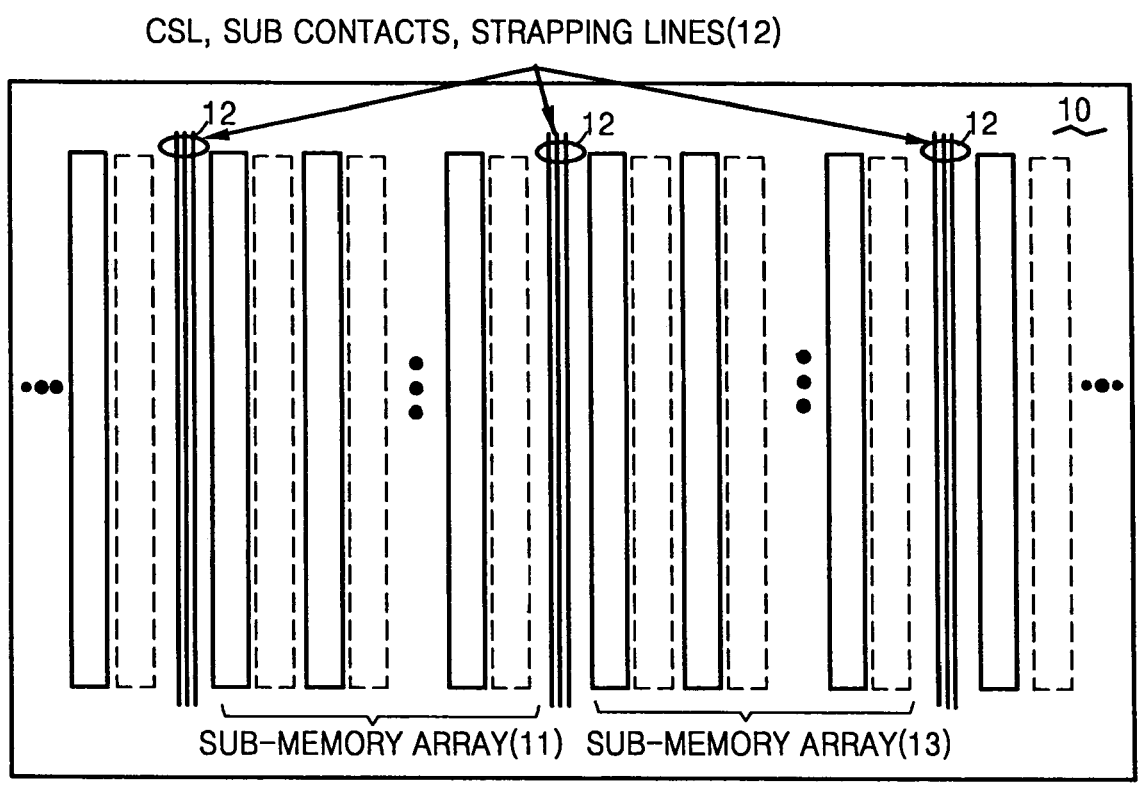
FIG. 1 is a block diagram of a conventional memory array including a plurality of sub-memory arrays.
Figure 2:
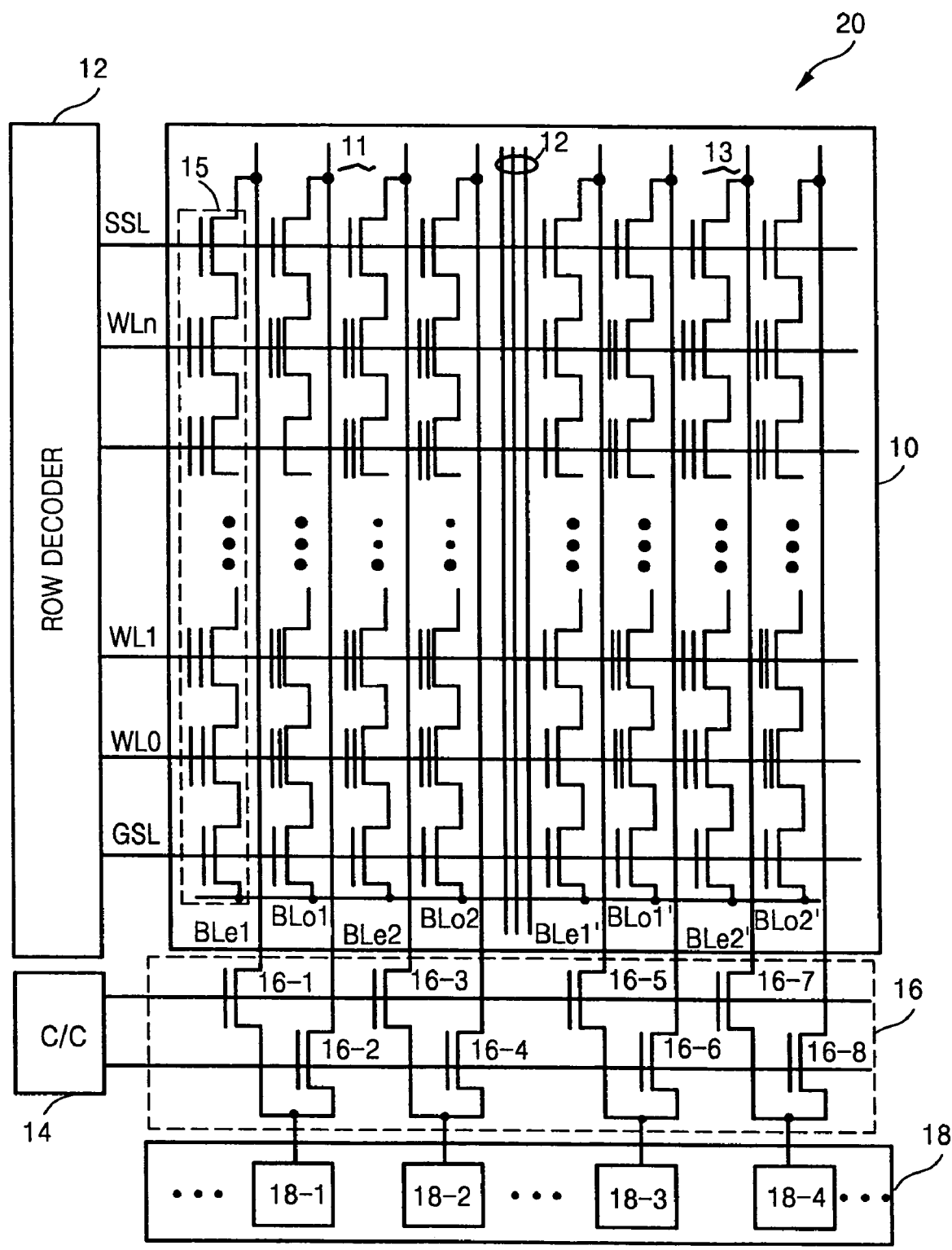
FIG. 2 is a block diagram of a non-volatile memory device including the memory array illustrated in FIG. 1.
Figure 3:
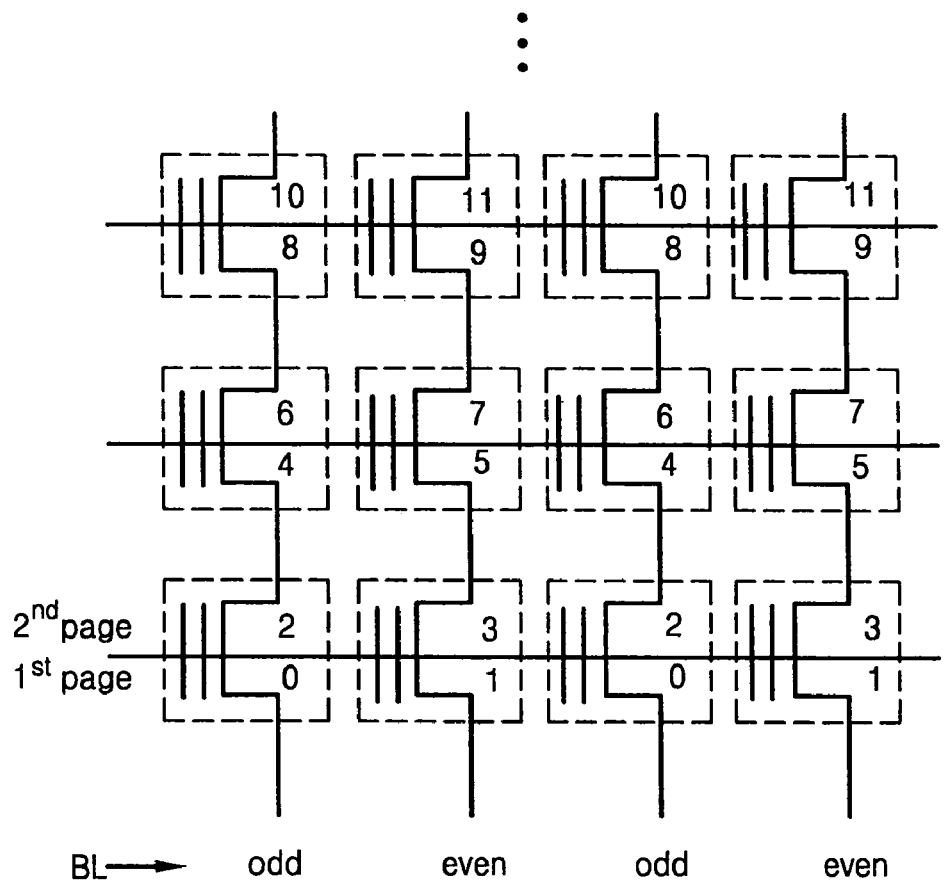
FIG. 3 is a block diagram illustrating an order in which memory cells in a sub-memory array illustrated in FIG. 2 are programmed.
Figure 11:
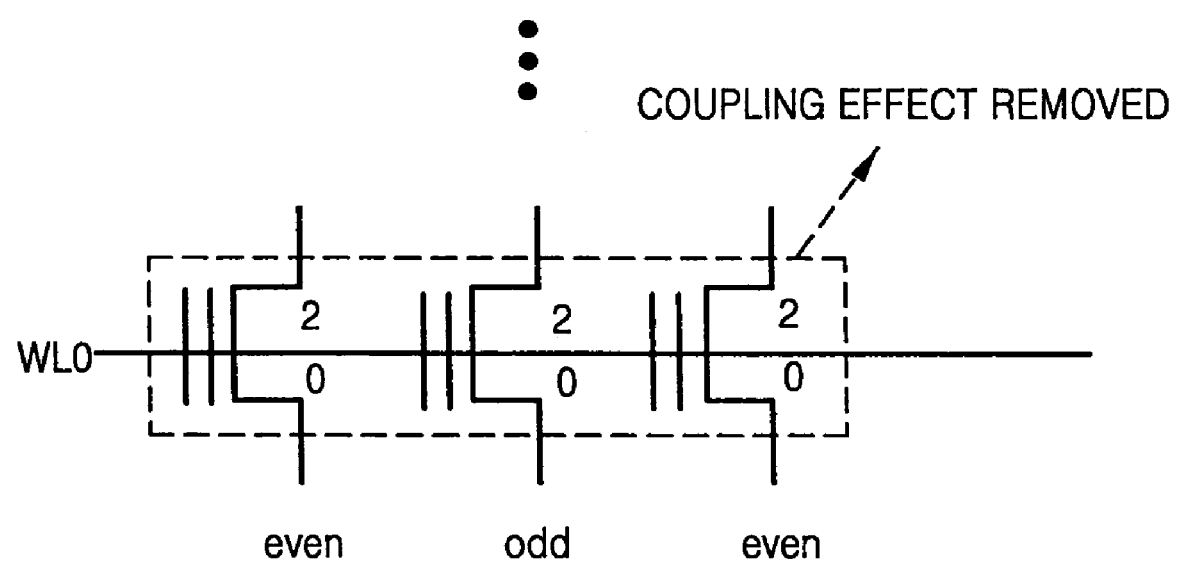
FIG. 11 is a diagram for explaining a coupling disturbance occurring in a horizontal direction when memory cells are programmed according to selected embodiments of the invention.
Figure 12A:
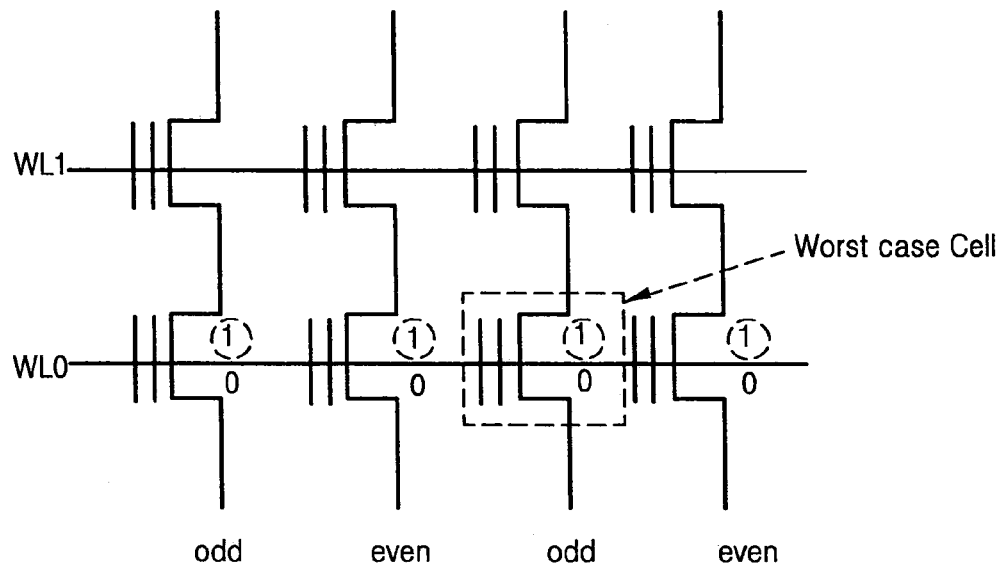
FIGS. 12A through 12D illustrate threshold voltage distributions of a memory cell in worst cases due to a coupling disturbance when memory cells are programmed according to selected embodiments of the present invention.
Figure 12A:
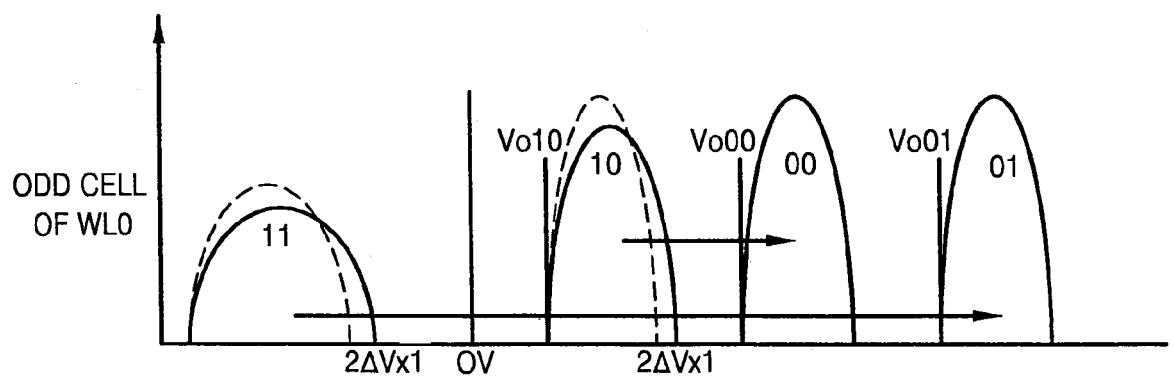
Figure 12A:
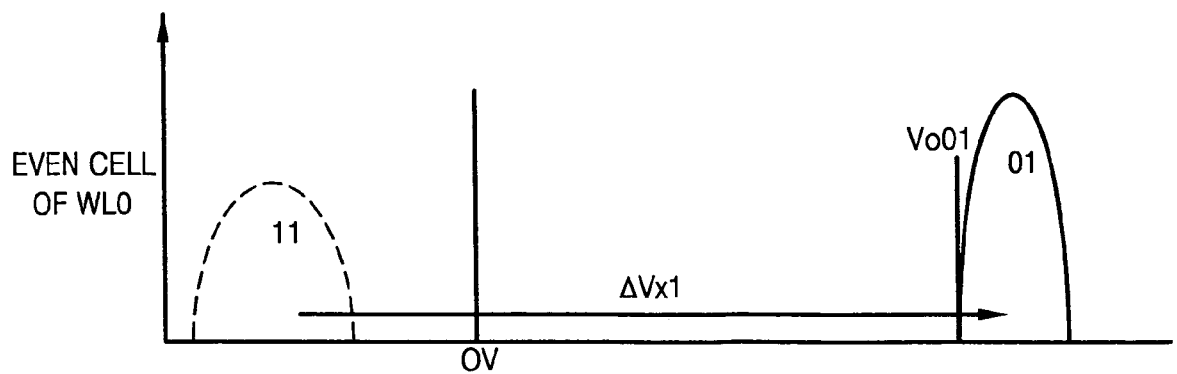
Figure 12B:
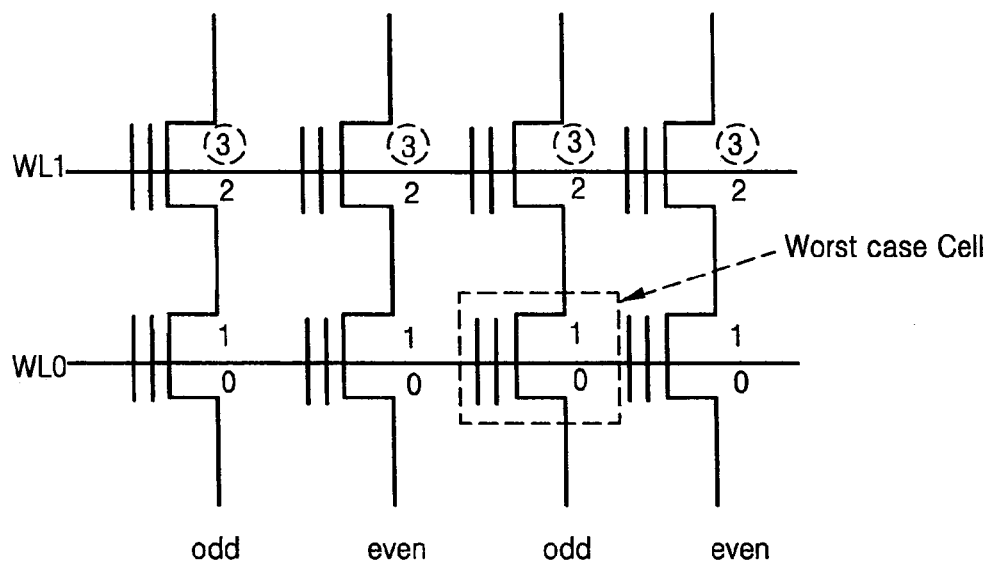
Figure 12B:
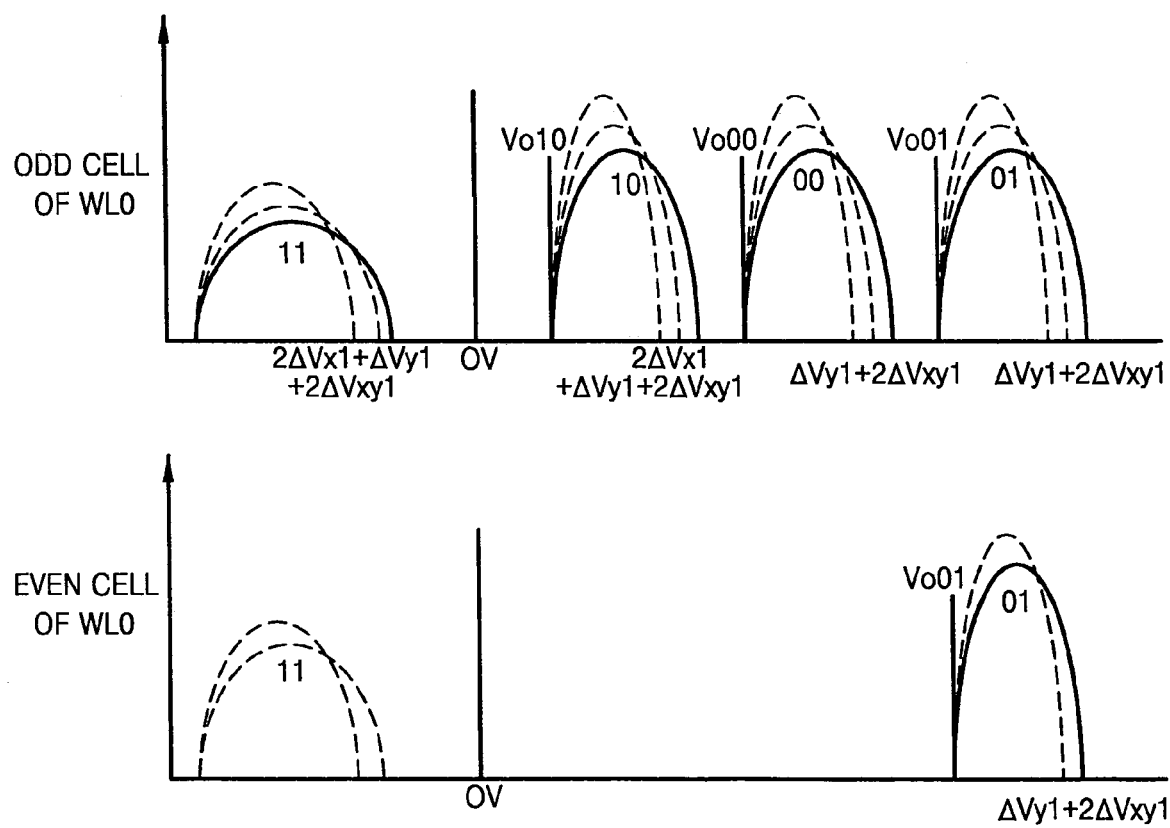
Figure 12C:
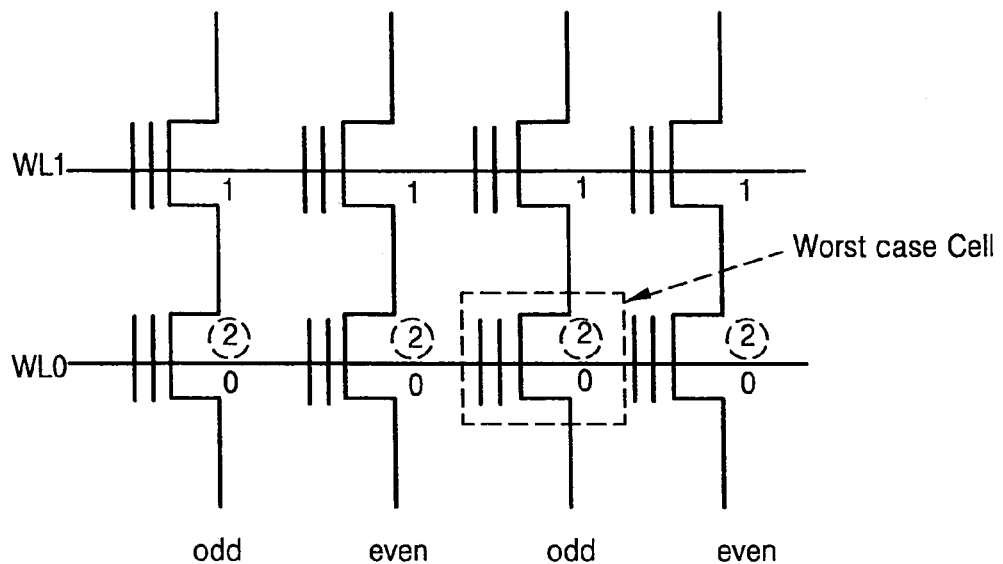
Figure 12C:
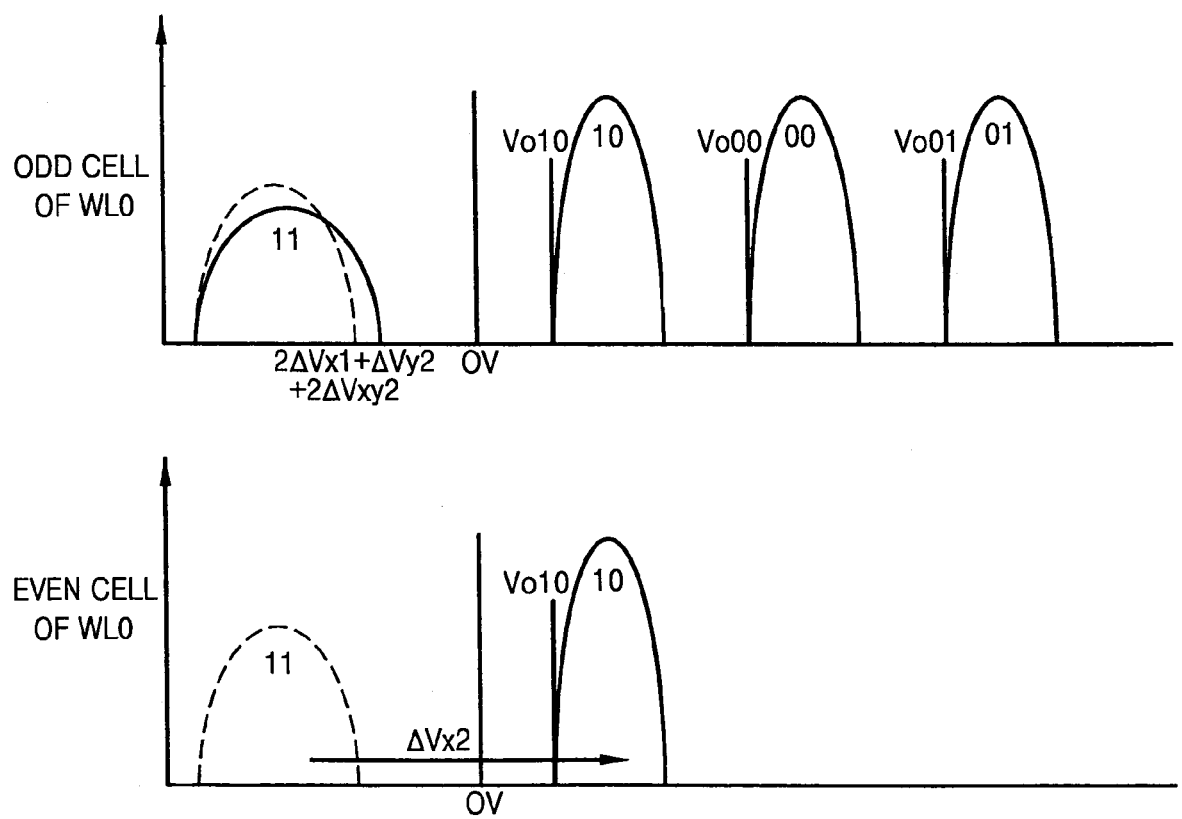
Figure 12D:
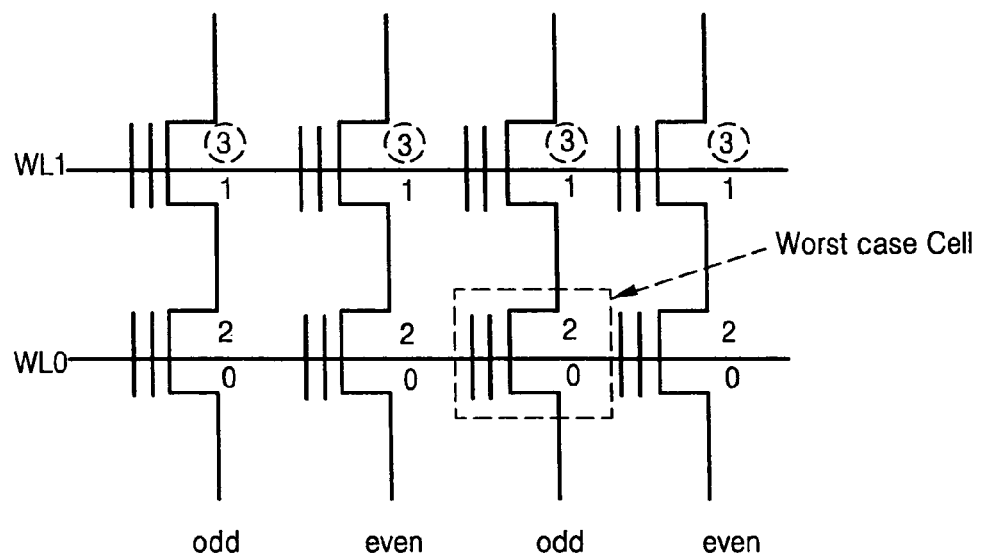
Figure 12D:
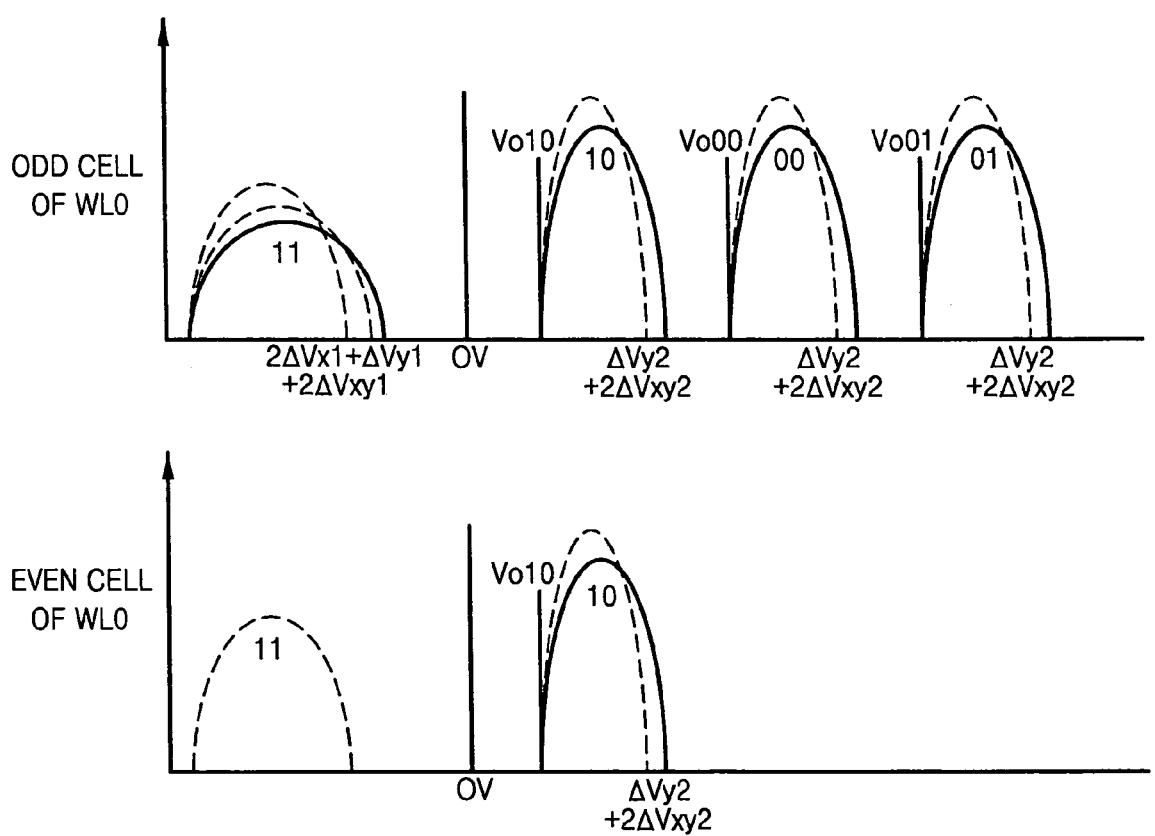

Page buffer 41 includes a plurality of data storage elements 40-1 through 40-4. Each of data storage elements 40-1 through 40-4 comprises a register including a plurality of latches. Page buffer 41 stores data to be programmed into memory array 30 in a program operation and also stores data that has been read from memory array 30 in a read operation. In addition, page buffer 41 may store data read from memory array 30 in a program verification operation. In the read mode, data storage elements 40-1 through 40-4 detect data stored in NAND flash EEPROM cells connected with a selected word line and first bit lines BLe1, BLo1, BLe2, and BLo2 or second bit lines BLe1', BLo1', BLe2', and BLo2'.

Where control signal generation circuit 34 generates control signals CS1 and CS2 to turn on first switches 36-1 through 36-4 at the same time, data storage elements 40-1 through 40-4 may apply a program inhibition voltage, e.g., a power supply voltage, or a program voltage, e.g., a ground voltage, to first bit lines BLe1, BLo1, BLe2, and BLo2, respectively, at one time in the program mode according to data to be programmed. Accordingly, unlike non-volatile memory device 20 illustrated in FIG. 2, non-volatile memory device 40 according to selected embodiments of the invention can simultaneously program all flash EEPROM cells in first sub-memory array 30-3 and connected with a selected word line. As a result, a coupling disturbance or a coupling effect between horizontally adjacent memory cells is avoided, as illustrated in FIG. 11.

In addition, where control signal generation circuit 34 generates control signals CS3 and CS4 to turn on second switches 37-1 through 37-4 at the same time, data storage elements 40-1 through 40-4 may apply the program inhibition voltage or the program voltage to second bit lines BLe1', BLo1', BLe2', and BLo2', respectively, at the same time in the program mode according to data to be programmed. Accordingly, unlike conventional non-volatile memory device 20 illustrated in FIG. 2, non-volatile memory device 40 according to selected embodiments of the invention can simultaneously program all flash EEPROM cells included in second sub-memory array 30-4 and connected with the selected word line. As a result, a coupling disturbance or a coupling effect that may be caused by adjacent memory cells is avoided, as illustrated in FIG. 11. Each of control signals CS1 through CS4 may include one or more bits.

Figure 10:
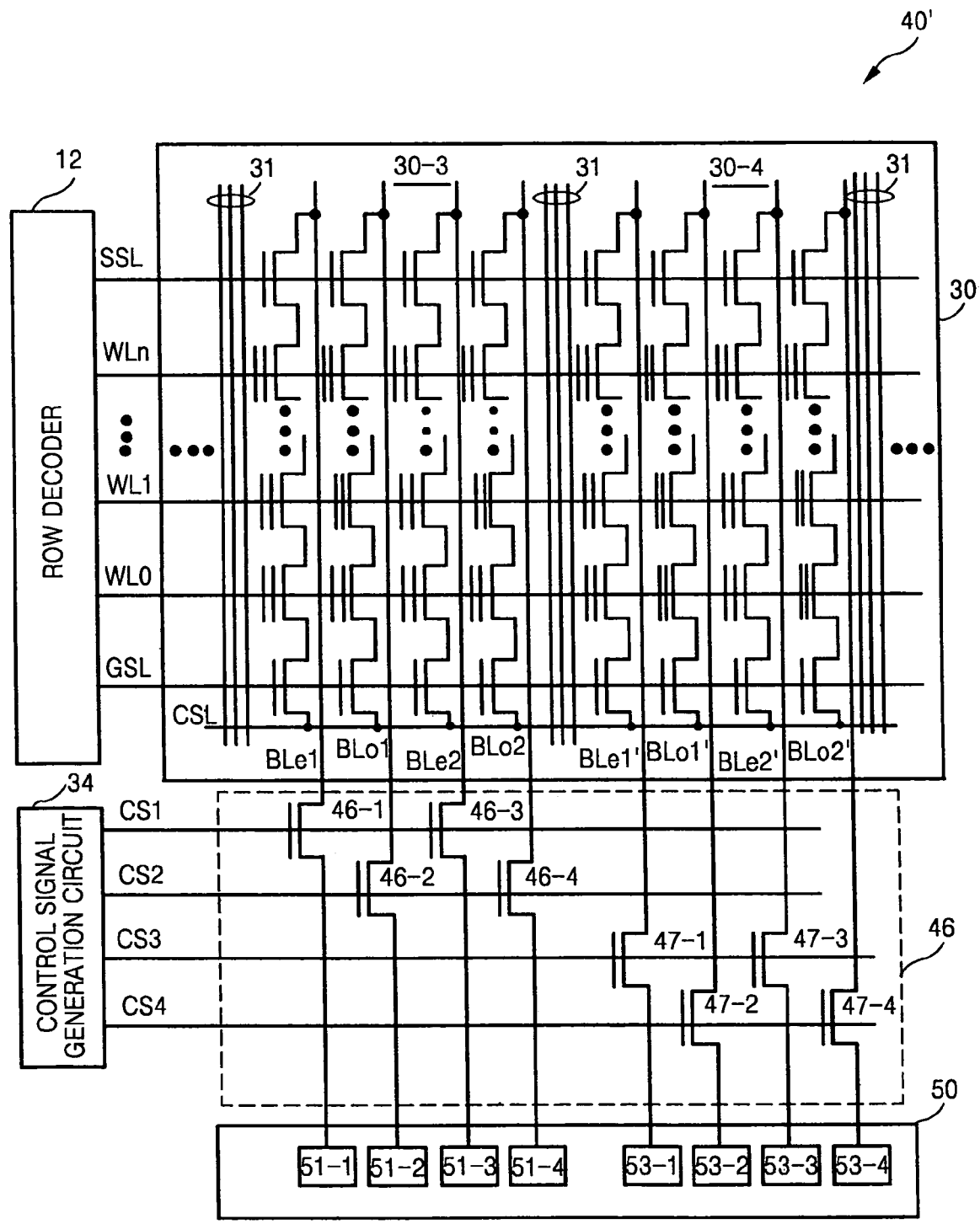
FIG. 10 is a block diagram of a non-volatile memory device including a memory array according to selected embodiments of the invention.

FIG. 10 is a block diagram of a non-volatile memory device 40' including a memory array according to selected embodiments of the invention. Non-volatile memory device 40' illustrated in FIG. 10 is similar to non-volatile memory device 40 illustrated in FIG. 9, except that a switching block 46 is substituted for switching block 36 and a page buffer 50 is substituted for page buffer 41.

Referring to FIG. 10, switching block 46 comprises first switches 46-1 through 46-4 and second switches 47-1 through 47-4 and page buffer 50 comprises first data storage elements 51-1 through 51-4 and second data storage elements 53-1 through 53-4. Each of data storage elements 51-1 through 51-4 and 53-1 through 53-4 typically comprises a register including at least one latch.

Each of first switches 46-1 through 46-4 comprises a MOS transistor and is referred to as a first transistor, and each of first transistors 46-1 through 46-4 is connected between a corresponding one among first bit lines BLe1, BLo1, BLe2, and BLo2 and a corresponding one among first data storage elements 51-1 through 51-4. For instance, transistor 46-1 is connected between first bit line BLe1 and first data storage element 51-1, transistor 46-2 is connected between first bit line BLo1 and first data storage element 51-2, transistor 46-3 is connected between first bit line BLe2 and first data storage element 51-3, and transistor 46-4 is connected between first bit line BLo2 and first data storage element 51-4.

Each of second switches 47-1 through 47-4 comprises a MOS transistor and is referred to as a second transistor, and each of second transistors 47-1 through 47-4 is connected between a corresponding one among second bit lines BLe1', BLo1', BLe2', and BLo2' and a corresponding one among second data storage elements 53-1 through 53-4. For instance, transistor 47-1 is connected between second bit line BLe1' and second data storage element 53-1, transistor 47-2 is connected between second bit line BLo1' and second data storage element 53-2, transistor 47-3 is connected between second bit line BLe2' and second data storage element 53-3, and transistor 47-4 is connected between second bit line BLo2' and second data storage element 53-4.

In a program mode, control signal generation circuit 34 generates control signals CS1 and CS2 to turn on first switches 46-1 through 46-4 at the same time, and first data storage elements 51-1 through 51-4 respectively apply the program inhibition voltage or the program voltage to bit lines BLe1, BLo1, BLe2, and BLo2 in first sub-memory array 30-3 at the same time according to data to be programmed. Accordingly, all flash EEPROM cells included in first sub-memory array 30-3 and connected with a selected word line can be simultaneously programmed. As such, a coupling disturbance or a coupling effect between horizontally adjacent memory cells is avoided, as illustrated in FIG. 11.

In the program mode, control signal generation circuit 34 may also generate control signals CS3 and CS4 at the same time to turn on second switches 47-1 through 47-4. In response, second data storage elements 53-1 through 53-4 respectively apply the program inhibition voltage or the program voltage to second bit lines BLe1', BLo1', BLe2', and BLo2' included in second sub-memory array 30-4 at the same time in the program mode according to data to be programmed. Accordingly, all flash EEPROM cells included in second sub-memory array 30-4 and connected with the selected word line can be simultaneously programmed. As a result, a coupling disturbance or a coupling effect between horizontally adjacent memory cells is avoided, as illustrated in FIG. 11.

Where control signal generation circuit 34 generates control signals CS1 through CS4 to simultaneously turn on first switches 46-1 through 46-4 and second switches 47-1 through 47-4, all flash EEPROM cells that are included in first and second sub-memory arrays 30-3 and 30-4 and are connected with the selected word line can be simultaneously programmed.

As described above, in the program mode or the read mode, a non-volatile memory device according to selected embodiments of the present invention can simultaneously program data into or read data from all memory cells that are included in first sub-memory array 30-3 and connected with a selected word line and can simultaneously program data into or read data from all memory cells that are included in second sub-memory array 30-4 and connected with the selected word line. In addition, in the program or read mode, the non-volatile memory device can simultaneously program data into or read data from all memory cells that are included in first and second sub-memory arrays 30-3 and 30-4 and connected with the selected word line.

A program control block performs at least one operation among a first program operation, in which all memory cells included in first sub-memory array 30-3 are simultaneously programmed, and a second program operation, in which all memory cells included in second sub-memory array 30-4 are simultaneously programmed, in response to at least one of control signals CS1 through CS4. The program control block includes a word line driving circuit, i.e., row decoder 12, page buffer 41 or 50, and switching block 36 or 46.

Figure 4:
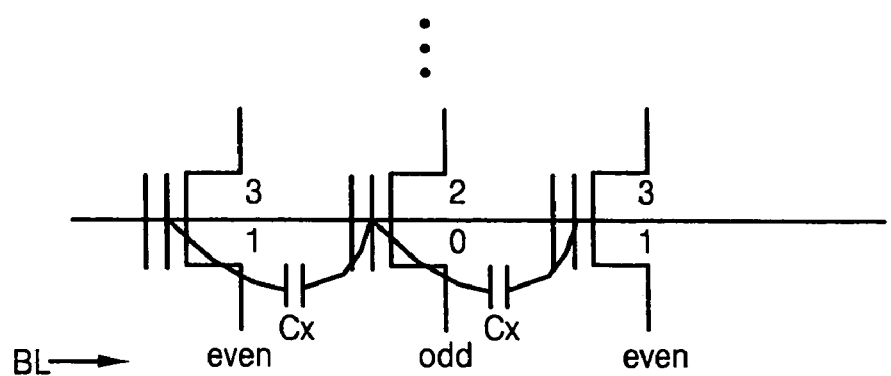
FIG. 4 is a conceptual diagram for explaining a coupling effect between conventional memory cells.
Figure 5A:
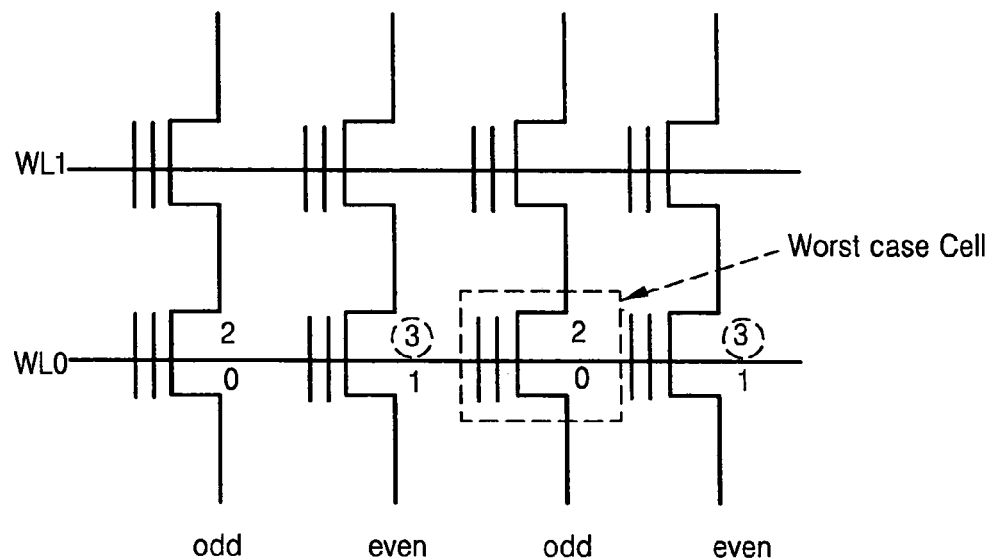
FIGS. 5A through 5D illustrate threshold voltage distributions of a memory cell affected by the coupling effect when memory cells in the memory array of FIG. 1 are programmed using a conventional method.
Figure 5A:
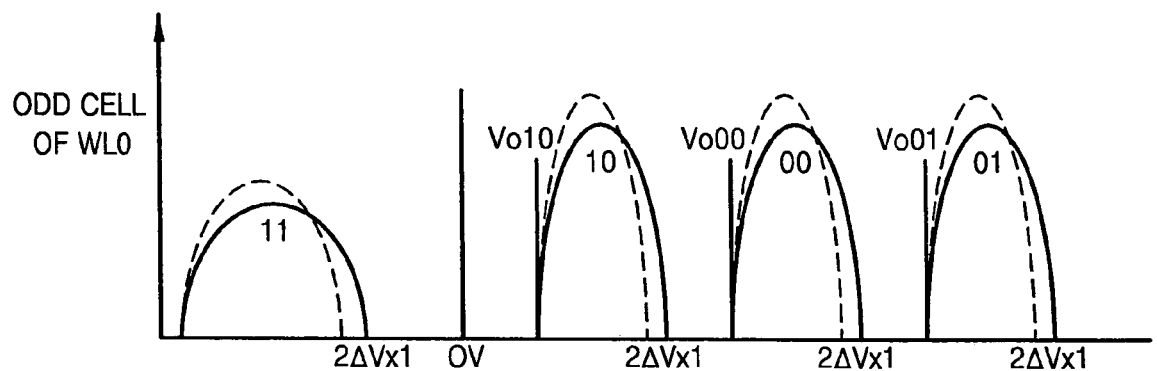
Figure 5A:
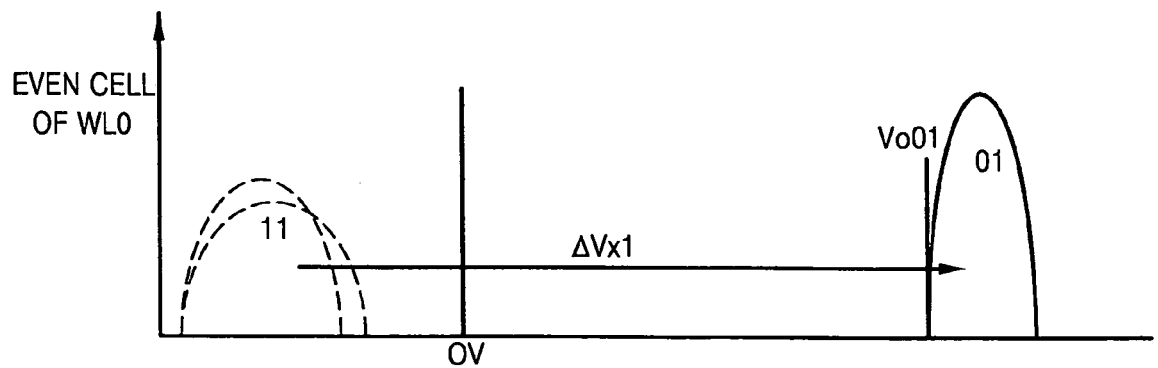
Figure 5B:
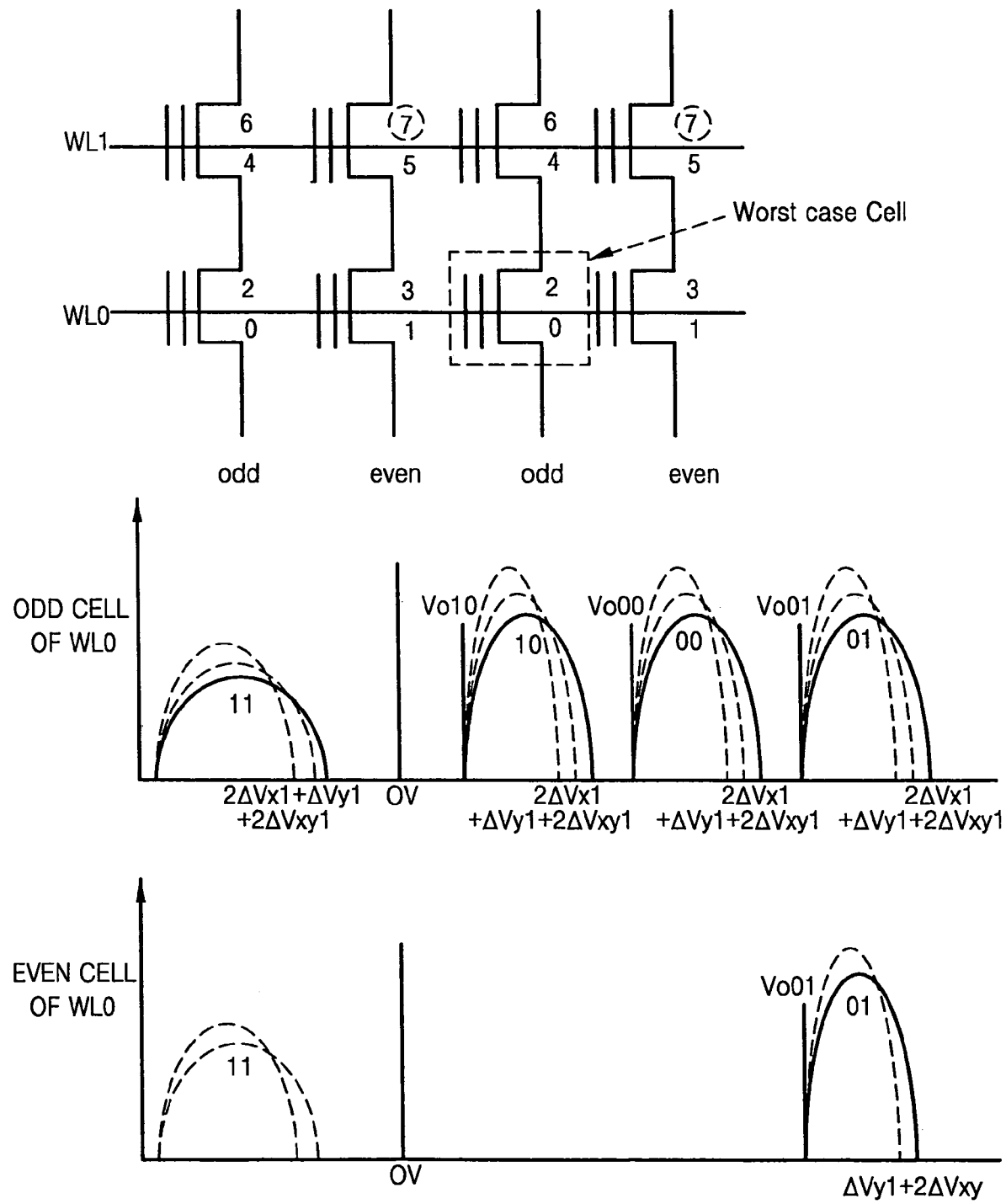
Figure 5C:
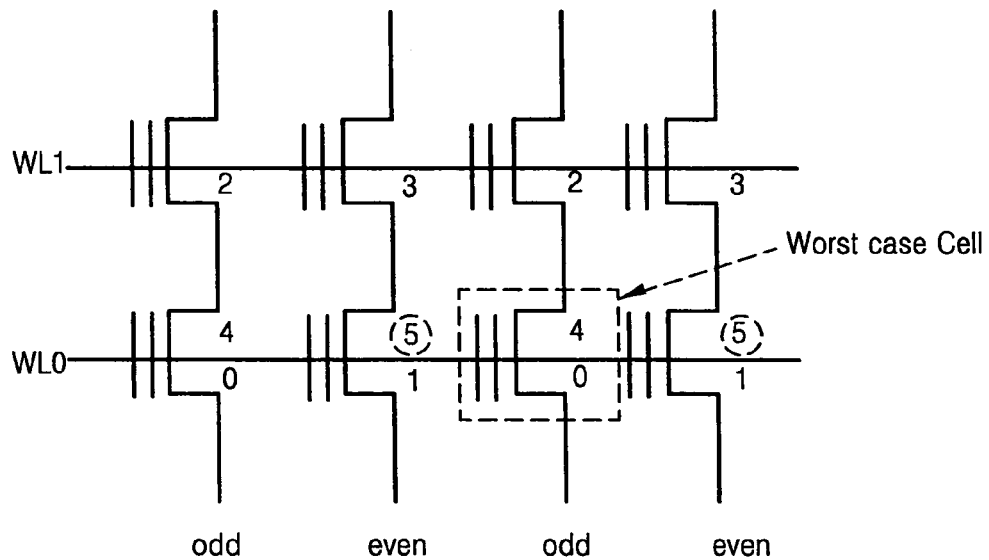
Figure 5C:
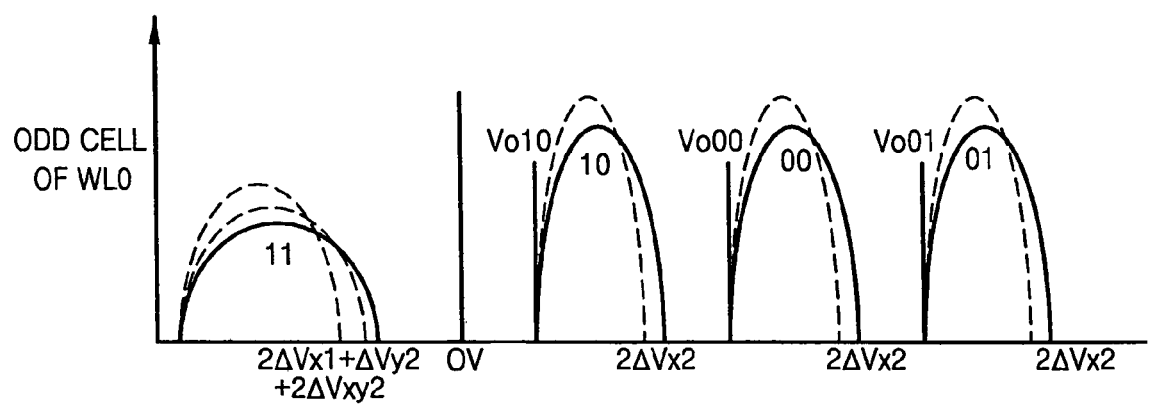
Figure 5C:
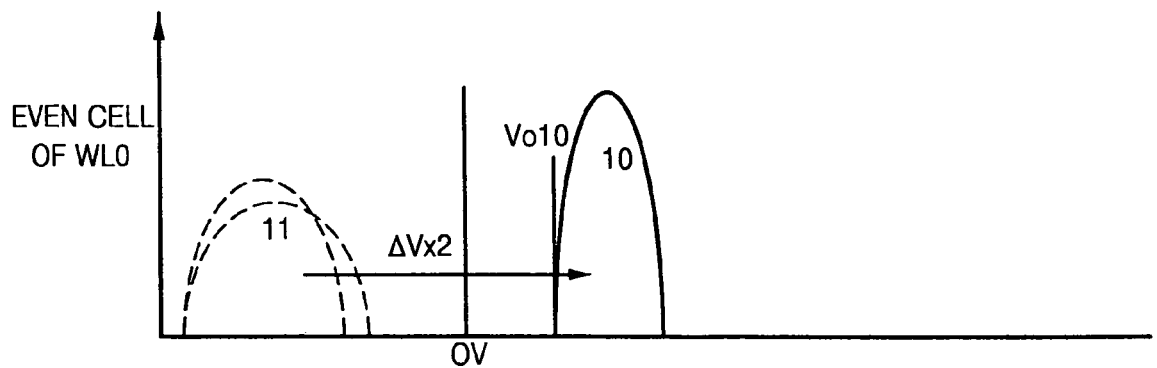
Figure 5D:
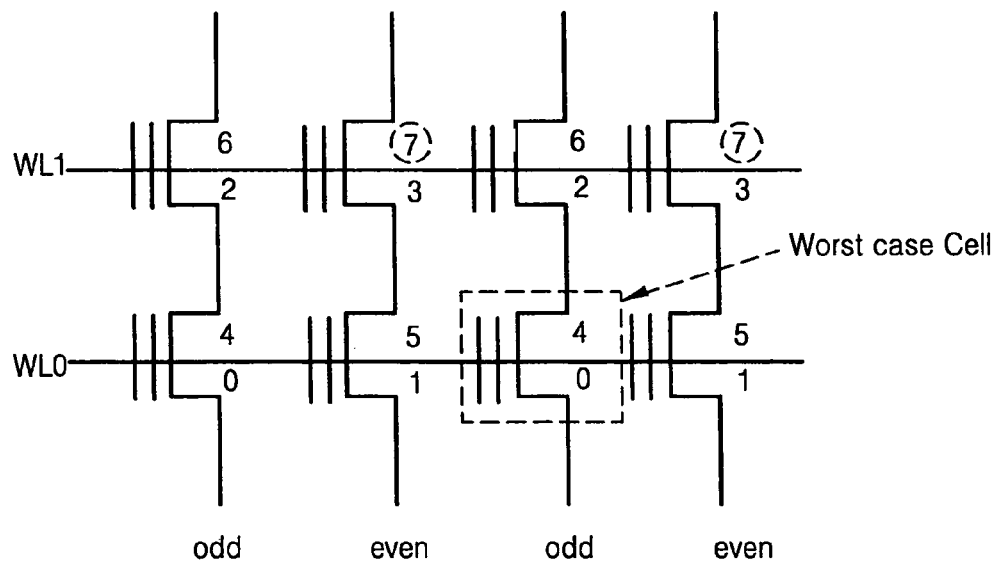
Figure 5D:
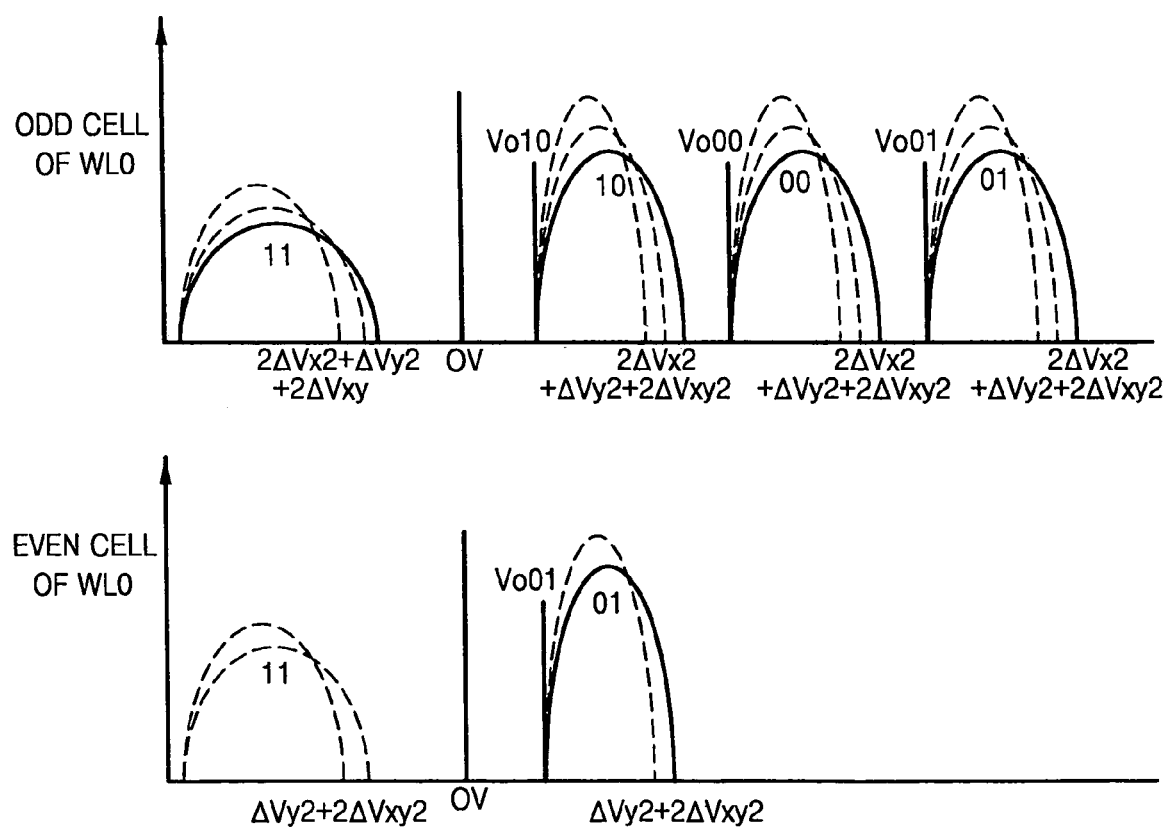

FIG. 11 is a diagram illustrating coupling disturbance between horizontally adjacent memory cells that are programmed according to selected embodiments of the present invention. Referring to FIGS. 4 and 11, where all memory cells connected with word line WL0 in a sub-memory block are simultaneously programmed according to selected embodiments of the present invention, a coupling effect or a coupling disturbance between horizontally adjacent memory cells is avoided.

FIGS. 12A through 12D illustrate threshold voltage distributions of a memory cell in worst cases where memory cells are programmed according to selected embodiments of the present invention. Compared with the threshold voltage distributions illustrated in FIGS. 5A through 5D, threshold voltage changes ΔVx1 or ΔVx2 are completely removed from the memory cell labeled "worst case cell" in FIGS. 12A through 12D. Accordingly, the non-volatile memory device according to selected embodiments of the present invention does not need to repeatedly perform the program operation in order to remove the effects of the coupling effect. As a result, the reliability of the non-volatile memory device is improved.

Figure 13:
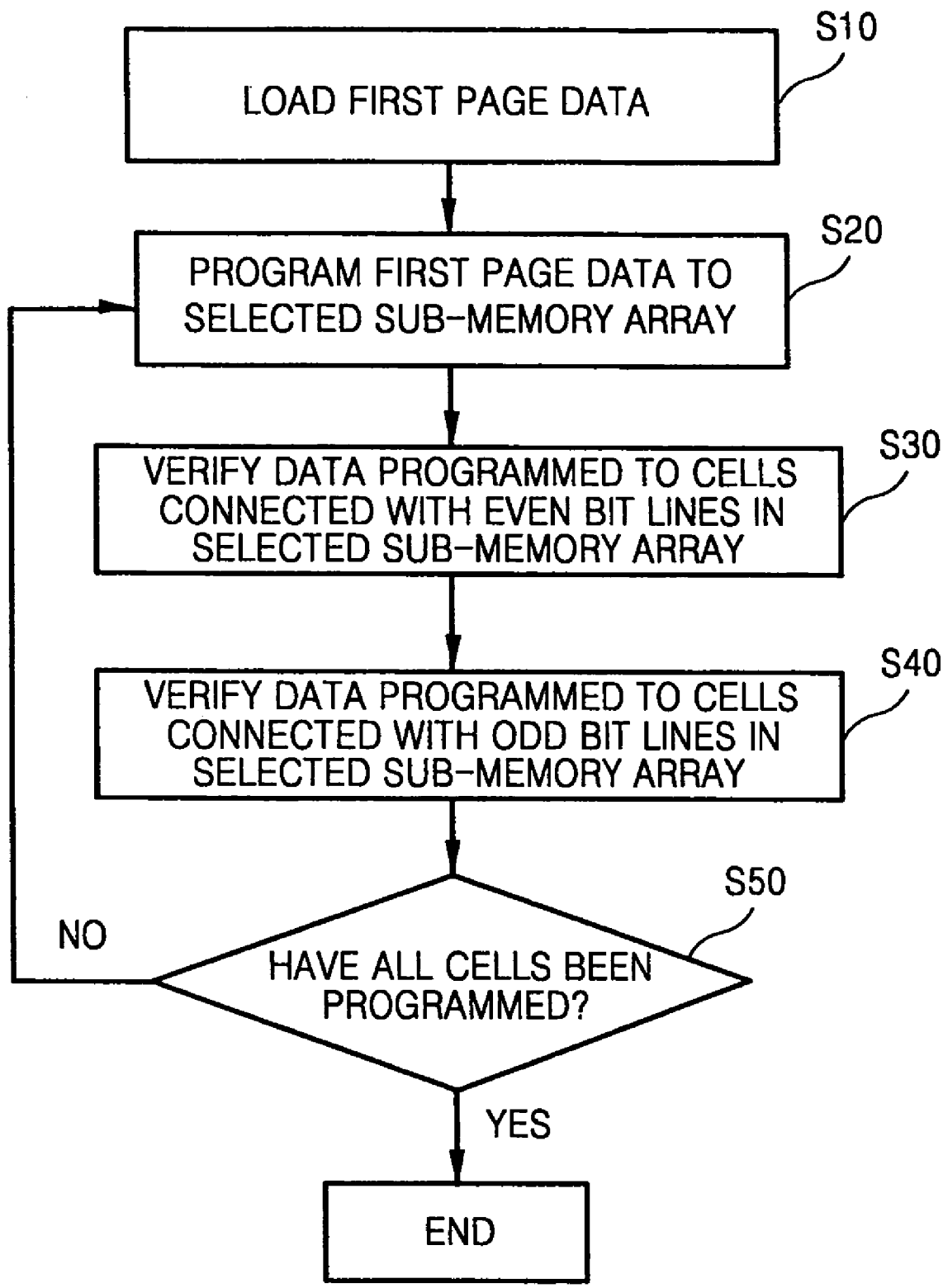
FIG. 13 is a flowchart illustrating a method of programming first page data according to selected embodiments of the invention.

FIG. 13 is a flowchart illustrating a method of programming first page data according to selected embodiments of the invention. In general, the program operation includes a programming procedure for injecting electrons into floating gates of selected memory cells and a program verification procedure for verifying whether programmed memory cells have reached a predetermined threshold voltage.

Referring to FIG. 9, FIGS. 12A through 12D, and FIG. 13, first page data is loaded into page buffer 41 in an operation S10. For explanation purposes, it will be assumed that the first page data is programmed into first sub-memory array 30-3.

However, a programming operation for other arrays such as second sub-memory array 30-4 can be performed similar to programming operation used to program first sub-memory array 30-3.

Where first sub-memory array 30-3 is selected, the first page data loaded into page buffer 41 is simultaneously programmed to memory cells included in first sub-memory array 30-3 through switches 36-1 through 36-4 in an operation S20. Then, during a program verification procedure for verifying whether the first page data has been properly programmed, page buffer 41 reads data from memory cells connected with even bit lines BLe1 and BLe2 through switches 36-1 and 36-3 turned on in response to first control signal CS1 and verifies the data in an operation S30. In addition, page buffer 41 also reads data from memory cells connected with odd bit lines BLo1 and BLo2 through switches 36-2 and 36-4 turned on in response to second control signal CS2 and verifies the data in an operation S40.

Where it is determined that the first page data has been successfully programmed to first sub-memory array 30-3 in operation S50, the method terminates. Otherwise, operations S20 through S50 are repeated until all of the selected memory cells reach a predetermined threshold voltage within a predetermined number of repetitions.

In non-volatile memory device 40 or 40' according to selected embodiments of the invention, the programming procedure may be performed with respect to each sub-memory array and the program verification procedure may be alternately performed with respect to a set of even bit lines and a set of odd bit lines. The first page data program operation illustrated in FIG. 13 corresponds to an LSB program operation, in which a first bit line voltage, e.g., a voltage for programming data "1" or data "0", is applied to all bit line included in the first sub-memory array 30-3 according to LSB data to be programmed so that the LSB data is programmed.

Figure 14:
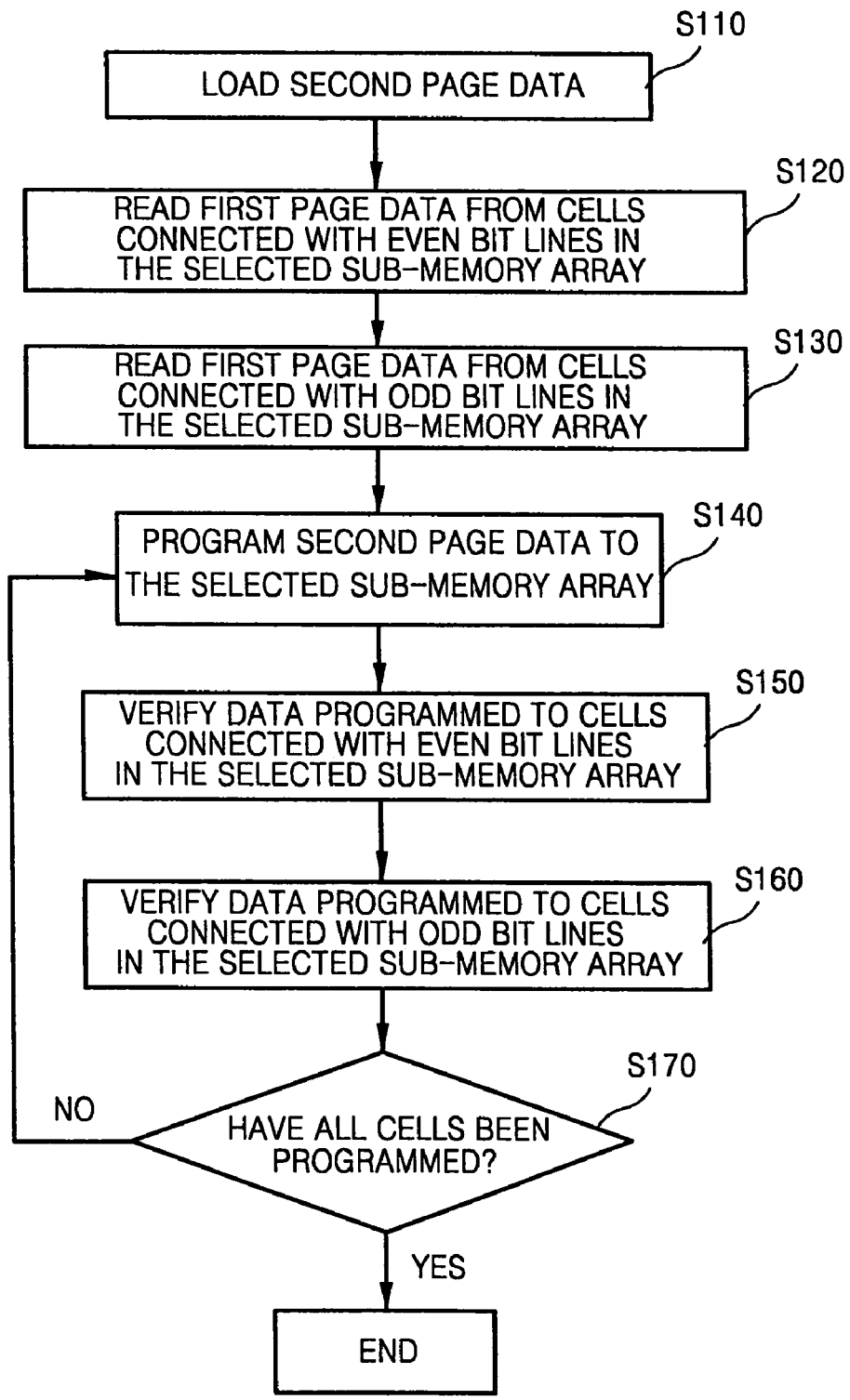
FIG. 14 is a flowchart illustrating a method of programming second page data according to selected embodiments of the present invention.

FIG. 14 is a flowchart illustrating a method of programming second page data according to selected embodiments of the present invention. Referring to FIG. 9, FIGS. 12A through 12D, and FIG. 14, second page data is loaded to page buffer 41 in operation S110. Again, for explanation purposes, it will be assumed that the second page data is programmed into first sub-memory array 30-3. However, a programming operation for other arrays such as second sub-memory array 30-4 can be performed similar to programming operation used to program first sub-memory array 30-3.

Where first sub-memory array 30-3 is selected, page buffer 41 reads first page data from memory cells connected with even bit lines BLe1 and BLe2 included in first sub-memory array 30-3 in an operation S120 and reads the first page data from memory cells connected with odd bit lines BLo1 and BLo2 included in first sub-memory array 30-3 in operation S130.

In operation S140, page buffer 41 programs the second page data based on data read in operations S120 and 130 and the second page data to be loaded. For instance, a second page data program operation corresponds to an MSB program operation in which LSB data that has been programmed to memory cells included in first sub-memory array 30-3 during the LSB program operation is sequentially read through even bit lines BLe1 and BLe2 and odd bit lines BLo1 and BLo2 and a second bit line voltage, e.g., a voltage for programming data "1" or "0", is applied to all bit lines included in first sub-memory array 30-3 based on the LSB data and MSB data.

During a program verification procedure for verifying whether the second page data has been properly programmed, page buffer 40 reads data from memory cells connected with the even bit lines BLe1 and BLe2 through the switches 36-1 and 36-3 turned on in response to the first control signal CS1 and verifies the data in operation S150. Page buffer 40 also reads data from memory cells connected with the odd bit lines BLo1 and BLo2 through the switches 36-2 and 36-4 turned on in response to second control signal CS2 and verifies the data in an operation S160.

Where it is determined that the second page data has been successfully programmed to first sub-memory array 30-3 in an operation S170, the method terminates. Otherwise, operations S140 through S170 are repeated. The second page data programming procedure may be performed with respect to each sub-memory array and the second page data program verification procedure may be alternately performed with respect to a set of even bit lines and a set of odd bit lines.

Where the above-described programming method is used, threshold voltage changes due to coupling between horizontally adjacent memory cells are substantially eliminated. Accordingly, the need for re-programming to remove the effects of coupling disturbance is reduced or eliminated, thereby increasing the reliability of memory cells while allowing high-speed programming.

The foregoing exemplary embodiments are teaching examples. Those of ordinary skill in the art will understand that various changes in form and details may be made to the exemplary embodiments without departing from the scope of the invention as defined by the following claims.

What is claimed is:

1. A method of operating a non-volatile memory device, wherein the non-volatile memory device comprises a memory array comprising a first sub-memory array including a plurality of cell strings and a plurality of even and odd bit lines respectively connected to the plurality of cell strings, a second sub-memory array including a plurality of cell strings and a plurality of even and odd bit lines respectively connected to the plurality of cell strings, and a strapping line extending in a column direction between the first sub-memory array and the second sub-memory array, the method comprising:
   receiving page data to be programmed; and
   simultaneously applying a bit line voltage corresponding to the page data to the plurality of even and odd bit lines in the first sub-memory array to program the page data in the plurality of cell strings in the first sub-memory array.

2. The method of claim 1, further comprising:
   in a first program verify operation, verifying the page data programmed in the cell strings connected to the even bit lines included in the first sub-memory array; and
   in a second program verify operation performed at a different time from the first program verify operation, verifying the page data programmed in the cell strings connected to the odd bit lines included in the first sub-memory array.

3. A method of programming a non-volatile memory device including a first sub-memory array, a second sub-memory array, a plurality of word lines connected to the first and second sub-memory arrays, and a plurality of strapping lines extending in a column direction between the first sub-memory array and the second sub-memory array, wherein the plurality of strapping lines includes a dummy bit line connected with at least one dummy cell string, and the method comprising:
   applying a first operating voltage to a selected word line among the plurality of word lines and applying a second operating voltage to all non-selected word lines among the plurality of word lines; and
   performing a first program operation by simultaneously programming data to all memory cells in the first sub-memory array and connected to the selected word line, wherein during the first program operation at least one voltage is applied to a common source line associated with memory cells of the first sub-memory array or a memory sub-region associated with the memory cells of the first sub-memory array via one of the plurality of strapping lines.

4. The method of claim 3, wherein the plurality of strapping lines is configured to apply the at least one voltage to respective regions of the first and second sub-memory arrays.

5. A non-volatile memory device comprising:
a first sub-memory array including a plurality of cell strings respectively connected with a plurality of first bit lines;
a second sub-memory array including a plurality of cell strings respectively connected with a plurality of second bit lines;
a strapping line formed between the first sub-memory array and the second sub-memory array;
a page buffer including a plurality of data storage elements; and
a switching block configured to perform a first switching operation for simultaneously connecting a first subset of the plurality of data storage elements with all of the respective first bit lines and a second switching operation for simultaneously connecting a second subset of the plurality of data storage elements with all of the respective second bit lines in response to at least one control signal.

6. The non-volatile memory device of claim 5, wherein the switching block comprises:
a plurality of first switches respectively connected between the respective first bit lines and the first subset of the plurality of data storage elements; and
a plurality of second switches respectively connected between the respective second bit lines and the second subset of the plurality of data storage elements.

7. The non-volatile memory device of claim 6, further comprising a control signal generation circuit configured to generate the at least one control signal for performing the first switching operation and the second switching operation.

8. The non-volatile memory device of claim 5, wherein the strapping line is configured to apply a voltage to respective regions of the first and second sub-memory arrays in which memory cells of the cell strings of the respective first and second sub-memories are formed.

9. A non-volatile memory device, comprising:
a memory array comprising a first sub-memory array including a plurality of cell strings respectively connected with a plurality of first bit lines, a second sub-memory array including a plurality of cell strings respectively connected with a plurality of second bit lines, and at least one strapping line disposed between the first sub-memory array and the second sub-memory array;
a page buffer including a plurality of first data storage elements and a plurality of second data storage elements; and
a switching block configured to perform a first switching operation to simultaneously connect the first data storage elements with the respective first bit lines in response to at least one first control signal, and further configured to perform a second switching operation to simultaneously connect the second data storage elements with the respective second bit lines in response to at least one second control signal.

10. The non-volatile memory device of claim 9, wherein the switching block comprises:
a plurality of first switches respectively connected between the respective first bit lines and the respective first data storage elements; and
a plurality of second switches respectively connected between the respective second bit lines and the respective second data storage elements.

11. The non-volatile memory device of claim 10, further comprising:
a control signal generation circuit configured to generate at least one control signal among the at least one first control signal, and further configured to generate the at least one second control signal.

12. A non-volatile memory device comprising:
a memory array including a first sub-memory array including a plurality of cell strings respectively connected with a plurality of first bit lines and a plurality of cell strings connected with a plurality of second bit lines, a second sub-memory array including a plurality of cell strings respectively connected with a plurality of third bit lines and a plurality of cell strings connected with a plurality of fourth bit lines, and a strapping line disposed between the first sub-memory array and the second sub-memory array;
a page buffer including a plurality of first data storage elements and a plurality of second data storage elements;
a plurality of first switches respectively connected between the first bit lines and the first data storage elements;
a plurality of second switches respectively connected between the second bit lines and the second data storage elements;
a plurality of third switches respectively connected between the third bit lines and the first data storage elements; and
a plurality of fourth switches respectively connected between the fourth bit lines and the second data storage elements.

13. The non-volatile memory device of claim 12, further comprising:
a control signal generation circuit configured to generate at least one control signal among a first control signal for turning on the first switches, a second control signal for turning on the second switches, a third control signal for turning on the third switches, and a fourth control signal for turning on the fourth switches.

14. A non-volatile memory device, comprising:
a word line;
a first sub-memory array including a plurality of memory cells connected to the word line and formed in a first conductivity type region;
a second sub-memory array including a plurality of memory cells connected to the word line and formed in the first conductivity type region;
a strapping line disposed between the first sub-memory array and the second sub-memory array and adapted to apply a voltage to the first conductivity type region; and,
a program control block configured to perform at least one operation during a first program operation programming first page data to the plurality of memory cells included in the first sub-memory array and during a second program operation programming second page data to the plurality of memory cells included in the second sub-memory array in response to at least one control signal during a program operation, wherein the program control block comprises:
    a word line driving circuit configured to apply a program voltage to the word line during the program operation;
    a page buffer including a plurality of data storage elements adapted to store data to be programmed during the program operation; and
    a switching block configured to perform a first switching operation simultaneously connecting all bit lines connected with the plurality of memory cells included in the first sub-memory array with the respective data storage elements during the first program operation, and a second switching operation simultaneously connecting all bit lines connected with the plurality of memory cells included in the second sub-memory array with the respective data storage elements during the second program operation.

15. The non-volatile memory device of claim 14, wherein the switching block comprises:
    a plurality of first switches each connected between a corresponding bit line among the bit lines connected with the plurality of memory cells included in the first sub-memory array and a corresponding data storage element among the plurality of data storage elements; and
    a plurality of second switches each connected between a corresponding bit line among the bit lines connected with the plurality of memory cells included in the second sub-memory array and a corresponding data storage element among the plurality of data storage elements.

16. The non-volatile memory device of claim 14, wherein each of the plurality of memory cells comprises a flash electrically erasable and programmable read only memory cell.

17. The method of claim 3, further comprising:
    while applying the first operating voltage to the selected word line among the plurality of word lines and applying the second operating voltage to all non-selected word lines among the plurality of word lines, performing a second program operation by simultaneously programming data to all memory cells included in the second sub-memory array and connected to the selected word line, wherein during the second program operation the at least one voltage is applied to a common source line associated with memory cells of the second sub-memory array, or a memory sub-region associated with memory cells of the second sub-memory array via one of the plurality of strapping lines.

* * * * *